(12) United States Patent
Fujikata et al.

(10) Patent No.: US 8,269,303 B2
(45) Date of Patent: Sep. 18, 2012

(54) SIGE PHOTODIODE

(75) Inventors: Junichi Fujikata, Tokyo (JP); Toru Tatsumi, Tokyo (JP); Akihito Tanabe, Tokyo (JP); Jun Ushida, Tokyo (JP); Daisuke Okamoto, Tokyo (JP); Kenichi Nishi, Tokyo (JP)

(73) Assignee: NEC Corporation, Tokyo (JP)

( * ) Notice: Subject to any disclaimer, the term of this patent is extended or adjusted under 35 U.S.C. 154(b) by 191 days.

(21) Appl. No.: 12/919,638

(22) PCT Filed: Mar. 9, 2009

(86) PCT No.: PCT/JP2009/054429
§ 371 (c)(1),
(2), (4) Date: Oct. 4, 2010

(87) PCT Pub. No.: WO2009/110632
PCT Pub. Date: Sep. 11, 2009

(65) Prior Publication Data
US 2011/0012221 A1    Jan. 20, 2011

(30) Foreign Application Priority Data

Mar. 7, 2008   (JP) ................................. 2008-057961

(51) Int. Cl.
*H01L 31/105* (2006.01)
(52) U.S. Cl. ............ 257/458; 257/459; 257/19; 257/21; 257/22; 257/436; 257/466
(58) Field of Classification Search ................ 257/458, 257/E31.061, 459, 19, 21, 22, 436, 466
See application file for complete search history.

(56) References Cited

U.S. PATENT DOCUMENTS
5,796,118 A * 8/1998 Morikawa et al. .............. 257/19
(Continued)

FOREIGN PATENT DOCUMENTS
JP          59-108376 A      6/1984
(Continued)

OTHER PUBLICATIONS

International Search Report for PCT/JP2009/054429 mailed Jun. 16, 2009.

(Continued)

*Primary Examiner* — Michael Shingleton

(57) ABSTRACT

The lattice mismatching between a Ge layer and a Si layer is as large as about 4%. Thus, when the Ge layer is grown on the Si layer, penetration dislocation is introduced to cause leakage current at the p-i-n junction. Thereby, the photo-detection sensitivity is reduced, and the reliability of the element is also lowered. Further, in the connection with a Si waveguide, there are also problems of the reflection loss due to the difference in refractive index between Si and Ge, and of the absorption loss caused by a metal electrode. In order to solve said problems, according to the present invention, there is provided a vertical type pin-SiGe photodiode having a structure which is embedded in a groove formed in a part of a Si layer, in which a p-type or n-type doped layer is formed in a lower section of the groove, and in which a i-SiGe layer having a rectangular shape or a reverse tapered shape is formed on a layered structure formed by laminating a i-Si layer and a SiGe buffer layer on the lower section and the side wall of the groove. Further, in an optical connection section with a Si waveguide, impedance matching is effected by the layered structure composed of the i-Si layer and the SiGe buffer layer, and an upper metal layer is separated therefrom so that a poly-Si bridge structure is employed to electrically connect the upper metal layer therewith.

9 Claims, 12 Drawing Sheets

U.S. PATENT DOCUMENTS 6,136,628 A * 10/2000 Sugiyama ................... 438/48
6,307,242 B1 * 10/2001 Sugiyama ................... 257/432

FOREIGN PATENT DOCUMENTS

| | | |
|---|---|---|
| JP | 7-94806 A | 4/1995 |
| JP | 8-107232 A | 4/1996 |
| JP | 8-204225 A | 8/1996 |
| JP | 8-204226 A | 8/1996 |
| JP | 9-205222 A | 8/1997 |
| JP | 10-98172 A | 4/1998 |
| JP | 10-163515 A | 6/1998 |
| JP | 10-270746 A | 10/1998 |
| JP | 2000298218 A | 10/2000 |
| JP | 2003163361 A | 6/2003 |
| JP | 2004172609 A | 6/2004 |
| JP | 2006133723 A | 5/2006 |
| JP | 2006522465 A | 9/2006 |
| JP | 2007527626 A | 9/2007 |
| WO | 2007105593 A | 9/2007 |

OTHER PUBLICATIONS

M. Oehme et al., "High bandwidth Ge p-i-n photodetector integrated on Si", Applied Physics Letters, vol. 89, 2006, pp. 071117-1~3.

T. Yin et al., "31GHz Ge n-i-p. waveguide photodetectors on Silicon-on-Insulator substrate", Optics Express, vol. 15, No. 21, 2007, pp. 13965-13971.

J. Liu et al., "Tensile strained Ge p-i-n photodetectors on Si platform for C and L band telecommunications", Applied Physics Letters, vol. 87, 2005, pp. 011110-1-3.

* cited by examiner

SIGE PHOTODIODE

TECHNICAL FIELD

The present invention relates to a photodiode which is used in the field of information processing and communication, and which converts an optical signal including an optical signal of infrared region into an electric signal at high speed. In particular, the present invention relates to a SiGe photodiode which converts an optical signal of 1.3 µm band to 1.55 µm band into an electric signal at high speed.

BACKGROUND ART

In view of cost and yield, it is very attractive to integrate a photo-detector into a monolithic integrated circuit by applying a technique of silicon electronics. A photo-detector made of silicon or germanium, which is monolithically integrated with a CMOS circuit on the same chip, is an attractive substitute for a hybrid photo-detector, such as an InGaAs photodiode, which is joined to a CMOS circuit or a GaAs circuit. The photo-detector that is formed in the shape of monolithically integrated circuit can be manufactured by using a standard silicon process, and hence is expected to be able to be manufactured at lower cost in comparison with that of the hybrid design.

A photodiode is very often used as means to convert an optical signal into an electric signal at high speed. A typical one is a pin-type photodiode. The pin-type photodiode is constructed in such a structure in which a i-layer of an intrinsic semiconductor is sandwiched between a p-layer of a p-type semiconductor and an p-layer of an n-type semiconductor. At the time of operation of the pin-type photodiode, a reverse bias voltage $V_R$ supplied from a bias power source is applied between the p-layer and the n-layer of the diode, so that substantially the whole region of the high resistance i-layer is converted to a layer of charge carrier depletion. An electric field exists in the depleted i-layer.

At such a case, when a photon having energy larger than the band gap Eg of the semiconductor composing the i-layer is incident and absorbed in the i-layer, electron-hole pairs are generated. The generated electrons and holes are accelerated by the electric field existing in the depleted i-layer, so that the electrons are drifted in the direction of the n-layer, and the holes are drifted in the direction of the p-layer. At that step, when the electrons and the holes encounter each other, they again form electron-hole pairs and disappear due to recombination between them. The concentrations $n_i$ and $p_i$ of the residual free carriers in the depleted i-layer are $n_i \approx 0$ and $p_i \approx 0$. Thus, it is possible to neglect that the concentrations $n_{ph}$ and $p_{ph}$ of the photo-carriers generated by the photo-absorption are reduced due to the recombination between the photo-carriers and the residual free carriers. When electrons generated by the photo-absorption reach the n-layer, they are outputted as "photocurrent" from the photodiode. The amount of the outputted "photocurrent" corresponds to the amount of photons ("absorbed photon amount") which are absorbed in the i-layer to generate the electron-hole pairs. The amount of the outputted "photocurrent" $I_{ph}$, which is converted by a load resistor $R_{load}$ into a voltage, is detected as a signal voltage of $V_{signal}$ ($=I_{ph} \cdot R_{load}$).

The main factors which limit the response speed of the optic-to-electric conversion by the pin type photodiode are the time constant of the circuit, which is determined by the product ($R_{load} \cdot C$) of the load resistor $R_{load}$ and the electric capacitance C formed by the depletion layer, and the carrier travelling time, which is required for the electrons and holes to pass through the depletion layer.

On the other hand, a photo-detector having sensitivity in a wavelength range from the 1.3 µm band to the 1.55 µm band is required in order to perform optical fiber communication at very high speed and over a long distance. Conventionally, a photo-detector using a compound semiconductor based material, such as InGaAs, has been used. However, by the use of SiGe or Ge which have sensitivity in the wavelength range from the 1.3 µM band to the 1.55 µM band, it has become possible to realize a low cost photo-detector to which a silicon process can be applied.

In a process of manufacturing a p-i-n type Ge photodiode, a Ge layer is, for example, selectively epitaxially grown on a highly doped Si layer by using $SiO_2$ as a mask, and then an upper electrode layer is further grown to laminate thereon, and thereby, a mesa structure is produced. Alternatively, after a heavy doped layer used as an electrode is formed on a planar substrate, a Ge layer is epitaxially grown thereon; an upper electrode layer is further grown to laminate thereover, and then, the layers are etched to produce a mesa structure therefrom.

In a pin type Ge photodiode disclosed in Non-Patent Document 1, a mesa structure is produced in such a manner that, after three-layered structure composed of $p^+$-Ge/i-Ge/$n^+$-Ge layers is laminated on Si with a buffer layer underlying thereunder, a mesa structure is formed therefrom by reactive etching using $CF_4$ gas. A passivation film made of $SiO_2$, which covers over the side edge surface of the mesa structure, is formed by a plasma CVD method to suppress the dark current (surface leakage current: $I_{surface-leak}$) flowing through the surface of the side end thereof. It is reported that a high speed response of 3 dB frequency $f_{3dm}$=about 39 GHz is obtained for an optical signal of a wavelength of λ=1.55 µm, in the case where the film thickness of i-Ge layer di=1 µm, the mesa diameter $r_{mesa}$=5 µm, the load resistance $R_{load}$=50Ω, and the applied bias $V_R$=−2V are chosen therefor.

A pin type Ge photodiode disclosed in Non-Patent Document 2 is a waveguide coupling type Ge photodiode formed on a rib type Si waveguide. In the production step of the pin type Ge photodiode, a mask for selective growth is formed by patterning a $SiO_2$ film deposited on the surface of the Si waveguide, and then an i-Ge layer is selectively grown on a part of a $p^+$ type Si waveguide. The light guided by the rib type Si waveguide is highly efficiently absorbed by the i-Ge layer laminated thereon. CMP processing is performed to flatten the selectively grown Ge layer, so that the film thickness of the Ge layer is set to 0.8 µm. Then, P is ion-implanted into the surface of the Ge layer to form an $n^+$ Ge layer, so that a waveguide coupling type Ge photodiode having a $p^+$-Si/i-Ge/$n^+$-Ge structure is produced.

In a pin type Ge photodiode disclosed in Non-Patent Document 3, a tensile distortion is introduced into a Ge layer deposited on the surface of a Si substrate by forming a C54-$TiSi_2$ layer on the rear surface of the substrate, so as to reduce the direct transition band gap Eg (Γ) of the Ge layer. Thereby, the photo-sensitivity equivalent to that of the InGaAs based photodiode as a conventional device is obtained in the C band (the wavelength of 1528 to 1560 nm) and the L band (the wavelength of 1561 to 1620 nm), which are the wavelength bands used in the wavelength multiplexed optical communication.

Patent Document 1 discloses a structure in which a Si/SiGe superlattice layer, which is used as a light absorbing layer of a photo detector, is formed by selective epitaxial growth in a recessed section formed in a substrate, of which side wall is coated with a side wall oxide film.

Further, Patent Document 2 discloses a photodetector in which a Si layer is used as a waveguide so that light from an optical fiber is guided into the waveguide, and in which a Si/SiGe superlattice layer is formed in a recessed section that is formed in the Si layer.

Patent Document 3 discloses a claimed invention relating to selection of a film thickness, in which claim the side wall of the recessed section of the Si layer is oxidized, so as to reduce the influence of the level difference due to the facet of the Si/SiGe superlattice layer that is epitaxially grown on the bottom section of the recessed section.

Nonpatent Document 1: M. Oehme, J. Werner, E. Kasper, M. Jutzi, and M. Berroth, "High bandwidth Ge p-i-n photodetector integrated on Si", Applied Physics Letters, Vol. 89, 07117 (2006) (NO. 071117—p. 1, FIG. 1)

Nonpatent Document 2: T. Yin, R. Cohen, M. M. Morse, G. Sarid, Y. Chetrit, D. Rubin, and M. J. Paniccia, "31 GHz Ge n-i-p waveguide photodetectors on Silicon-on-Insulator substrate", Optics Express, Vol. 15, 13965, (2007) (p. 13967, FIG. 1)

Nonpatent Document 3: J. Liu, D. D. Cannon, K. Wada, Y. Ishikawa, S. Jongthammanurak, D. T. Danielson, J. Michel, and L. C. Kimerling, "Tensile strained Ge p-i-n photodetectors on Si platform for C and L band telecommunications", Applied Physics Letters, Vol. 87, 011110, (2005) (No. 011110—p. 1, FIG. 1, No. 011110—p. 2, FIG. 2)

Patent Document 1: JP10-270746 A (p. 5, FIG. 1)
Patent Document 2: JP09-205222 A (p. 7, FIG. 2)
Patent Document 3: JP10-163515 A (p. 7, FIG. 1)

DISCLOSURE OF THE INVENTION

Problems to be Solved by the Invention

A Ge photodiode using a Ge layer as the light absorbing layer has the following problems. First, as the lattice mismatching between the Ge layer and the Si layer that is as the substrate therefor is as large as about 4%, penetration dislocation is introduced therein when the Ge layer is grown on the Si layer. The trap level associated with the penetration dislocation functions as a recombination center, so that the leakage current originated from the penetration dislocation is generated at the p-i-n junction. Thereby, the photo-detection sensitivity is reduced. Further, the reliability of the devise is also lowered.

Further, in recent years, there have been proposed techniques for suppressing the generation of the misfit dislocation so as to reduce the dislocation density in the Ge epitaxial layer on the Si layer. First, a technique has been proposed, in which a buffer layer made of $Si_xGe_{1-x}$ is formed on the Si layer, and then a Ge layer is grown on the $Si_xGe_{1-x}$ buffer layer, which reduces the influence of the lattice mismatch. Further, a technique has also been proposed, in which, after the growth of the Ge layer, the Ge layer is subjected to a heat treatment step so as to reduce the density of penetration dislocation introduced at the growth step.

However, in the Ge photodiode having the mesa structure, when the mesa diameter $r_{mesa}$ is reduced, the influence of the surface defect that is present on the facet of the side surface of the Ge layer is relatively increased, in place of that of the penetration dislocation which exists in the p-i-n junction. That is, when a p-i-n type Ge photodiode having a small mesa diameter $r_{mesa}$ is formed for the purpose of attaining a high speed response, there is a problem that the leakage current in the side wall surface of the Ge layer cannot be neglected.

When there is no tensile strain, the direct transition band gap Eg (Γ) of Ge is about 0.81 eV, and thus, the photoabsorption coefficient $\epsilon$ (Ge: λ=1.55 μm) at the wavelength λ=1.55 μm is smaller than the photo-absorption coefficient $\epsilon$ (Ge: λ=1.3 μm) at the wavelength λ=1.3 μm. A technique has also been proposed, in which when the band of wavelength 1.55 μm is used as the wavelength λ of the optical signal used for optical communication in place of the band of wavelength 1.3 μm, tensile distortion is introduced into the Ge layer used as the photo-absorption layer to resolve the degeneration of Ev (Γ) of the valence band for the heavy holes and light holes, and thereby, the direct transition band gap Eg (Γ) is reduced, resulting in improvement in the performance of light sensitivity in the 1.55 μm band. Specifically, the technique is based on such a process in which, when a Ge layer is epitaxially grown on a Ge buffer layer that is low-temperature grown on a Si substrate, and then the Ge layer is cooled from the growth temperature, the tensile distortion that is due to the difference ($\beta_{Ge}-\beta_{Si}$) between the thermal expansion coefficient $\beta_{Si}$ of Si and the thermal expansion coefficient $\beta_{Ge}$ of Ge is introduced into the Ge layer. The introduced tensile distortion is dependent on the difference ($\beta_{Ge}-\beta_{Si}$) in the thermal expansion coefficient between Si and Ge and the temperature difference ΔT between the growth temperature and the room temperature. Thus, the amount of distortion $\sigma_{tensile}$ (ΔT) is within the limited range. Therefore, the amount of distortion $\sigma_{tensile}$ (ΔT), which can be introduced into the Ge or SiGe layer that is used as a photo-absorption layer with a film thickness $d_i$ for a Ge or SiGe photodiode having a mesa structure, is limited.

On the other hand, with the rapid progress of Si photonics based on the Si waveguide for the optical signal at the wavelength of from the 1.3 μm band to the 1.55 μm band, the development of an optical waveguide coupling type Ge photodiode has been actively progressed. Most of the reports are concerned with approaches employing such a structure that a Ge layer is selectively epitaxially grown on a part of the surface of the Si waveguide. That is, employed is such a structure in which the "evanescent coupling" is used for the optical coupling between the Si waveguide and the Ge photo-absorption layer. In the case of this structure, when a three-layered structure composed of $p^+$-Ge/i-Ge/$n^+$-Ge layers is employed as the Ge layers to be selectively grown on the surface of the Si waveguide, a heavy doped Ge layer (for example, $p^+$-Ge layer) that is in contact with the Si waveguide is to be formed as the lower electrode layer. In such a case, the minority carriers (for example, electrons) generated by the photo-absorption in the heavy doped Ge layer (for example, $p^+$-Ge layer) will disappear through recombination with the majority carriers (for example, holes). In the case of the structure using the "evanescent coupling", as the optical signal, which advances in the direction parallel to the interface between the Si waveguide and the Ge layer, is affected by absorption in the lower electrode layer, there is such a problem that such "loss due to the photo-absorption" that it will cause reduction in the level of the optical signal reaching the i-Ge layer that is used as the light absorbing layer.

The present invention aims to solve the aforementioned problems. An object of the present invention is to provide a p-i-n type SiGe photodiode employing, as a photo-absorption layer thereof, a $Si_{1-x}Ge_x$ layer that can be formed on the Si substrate, which has a structure suitable for achieving a highly efficient optical coupling with a Si waveguide that is formed on a Si substrate. Specifically, an object of the present invention is to provide a device structure of a p-i-n type SiGe photodiode which, when the area size $S_{pin-junction}$ of the p-i-n junction is reduced, can reduce the influence of the leakage current ($I_{dislocation-leak}$) due to the penetration dislocation and the influence of the leakage current ($I_{surface-leak}$) due to the side wall surface of the p-i-n junction, and which can further be highly efficiently coupled with the Si optical waveguide and, as a result, which will provide a high photo-detection sensitivity and high speed performance.

Means for Solving the Problems

A SiGe photodiode according to the present invention is a p-i-n type photodiode, in which a couple of p-type and n-type doped electrode layers are formed on the top and rear faces thereof, and a $Si_xGe_{1-x}$ semiconductor absorption layer is formed between the couple of electrode layers. The specific feature of its structure is such a structure that it comprises the $Si_xGe_{1-x}$ semiconductor absorption layer embedded in a groove that is formed in a part of a Si layer, wherein a p-type or n-type doped lower electrode layer is formed in a lower section of the groove, and then the $Si_xGe_{1-x}$ semiconductor absorption layer having a rectangular shape or a reverse tapered shape is formed on a layered structure that is formed by laminating a Si intrinsic semiconductor layer and a SiGe buffer layer on the lower section and the side wall of the groove.

That is, the SiGe photodiode according to the present invention is:

a p-i-n type photodiode composed of a $Si_xGe_{1-x}$ semiconductor absorption layer, an upper electrode layer provided on the top face thereof, and a lower electrode layer provided under the rear face thereof, wherein the p-i-n type photodiode has a structure in which is formed by embedding the $Si_xGe_{1-x}$ semiconductor absorption layer is embedded in a groove formed in a part of a Si layer, and which comprises:

a p-type or n-type doped lower electrode layer formed in a lower section of the groove;

a layered structure composed of a Si intrinsic semiconductor layer and a SiGe buffer layer formed on the lower section and the side wall of the groove;

the $Si_xGe_{1-x}$ semiconductor absorption layer which has a rectangular shape or a reverse tapered shape and which is formed on the layered structure; and an n-type or p-type doped upper electrode layer that is formed in an upper section of the groove.

In such a case, it is preferred that the upper electrode layer is formed on the top surface of the $Si_xGe_{1-x}$ semiconductor absorption layer, and that the area size of the upper electrode layer $S_{upper-electrode\ layer}$ and the area size of the bottom surface $S_{bottom\ surface}$ of the $Si_xGe_{1-x}$ semiconductor absorption layer are selected so as to satisfy the relationship of $S_{bottom\ surface} > S_{upper-electrode layer}$.

Further, in the SiGe photodiode according to the present invention, it is preferred to select a configuration in which the p-i-n type photodiode is optically connected to a Si waveguide, and in which, when the $Si_xGe_{1-x}$ semiconductor absorption layer is optically connected to the Si waveguide via the layered structure composed of the Si intrinsic semiconductor layer and the SiGe buffer layer, impedance matching is effected at the optical connection portion.

In such a case, it is preferred to employ such a structure in which the upper electrode layer is electrically connected to an upper metal electrode layer, wherein the electrical connection between the upper electrode layer and the upper metal electrode layer is achieved by a bridge structure made of polycrystalline Si.

For example, it may be constructed in the following shape:

In which the bridge structure made of polycrystalline Si is composed of a polycrystalline Si bridge array, wherein the bridge structure made of polycrystalline Si is composed of a polycrystalline Si bridge array, and wherein the polycrystalline Si bridge array has a structure in which a plurality of polycrystalline Si bridges are periodically arranged, and in which the selection of a wavelength region is made by the periodic structure.

On the other hand, the SiGe photodiode according to the present invention may be used to construct an optical wiring system or an optical interconnection module, as described below.

Accordingly, the optical wiring system according to the present invention is an optical wiring system on an LSI, wherein the SiGe photodiode having the aforementioned structure according to the present invention having the aforementioned structure is comprised, as a photo-detection section.

Further, the optical interconnection module according to the present invention is an optical interconnection module comprising: a Si substrate in which the SiGe photodiode having the aforementioned structure according to the present invention is formed; and an LSI electronic circuit which is formed on the Si substrate monolithically with the photodiode.

EFFECTS OF THE INVENTION

The SiGe photodiode according to the present invention employs such a structure in which the $Si_xGe_{1-x}$ semiconductor absorption layer is embedded in the groove formed in a part of the Si layer, wherein the layered structure composed of the Si intrinsic semiconductor layer and the SiGe buffer layer, which are formed on the lower section and the side wall of the groove, is provided, and then, the $Si_xGe_{1-x}$ semiconductor absorption layer having a rectangular shape or a reverse tapered shape is formed on the layered structure. Thereby, the side wall surface of the $Si_xGe_{1-x}$ semiconductor absorption layer is covered by the layered structure composed of the Si intrinsic semiconductor layer and the SiGe buffer layer, and hence the influence of the leakage current due to the side wall surface is reduced. Further, the effect of reducing the density of penetration dislocation in the $Si_xGe_{1-x}$ semiconductor absorption layer is also obtained by using the SiGe buffer layer. For example, in the case where a Si optical waveguide is formed from the Si layer, the optical coupling between the Si optical waveguide and the $Si_xGe_{1-x}$ semiconductor absorption layer is effected in the form of a butt connection on the side wall surface of the $Si_xGe_{1-x}$ semiconductor absorption layer via the layered structure composed of the Si intrinsic semiconductor layer and the SiGe buffer layer. In such a case, the $Si_xGe_{1-x}$ semiconductor absorption layer can be highly efficiently coupled with the optical waveguide by reducing the reflectance at the interfaces between the i-Si, SiGe and $Si_xGe_{1-x}$ layers by adjusting the film thickness of the SiGe buffer layer. When said advantages are utilized, even in the case where the area size $S_{pin}$ of the pin junction is decreased to reduce the circuit time constant that is determined by the product ($R_{load} \cdot C$) of the load resistor $R_{load}$ and the electric capacitance C formed by the depletion layer, and where the film thickness $d_i$ of the $Si_xGe_{1-x}$ semiconductor absorption layer is relatively lessened to reduce the carrier travelling time, the length $L_i$ in the optical waveguide direction, along which photo-absorption is performed, can be selected independently of the film thickness $d_i$, and hence the photo-detection sensitivity can be kept high. Therefore, it is possible to realize a photodiode structure highly efficiently coupled with a Si optical waveguide, and it is possible to realize a SiGe photodiode which is high speed and which can be integrated together with the other elements on a Si substrate.

BRIEF DESCRIPTION OF THE DRAWINGS

FIG. 8-1 is sectional views showing a process for manufacturing the SiGe photodiode of the third exemplary embodiment according to the present invention, and showing steps (a), (b), (c) and (d) thereof;

FIG. 8-2 is a sectional view showing a process for manufacturing the SiGe photodiode of the third exemplary embodiment according to the present invention, and showing steps of (e), (f) and (g) thereof;

FIG. 8-3 is a sectional view showing a process for manufacturing the SiGe photodiode of the third exemplary embodiment according to the present invention, and showing steps of (h) and (i) thereof;

DESCRIPTION OF SYMBOLS

Figure 1:
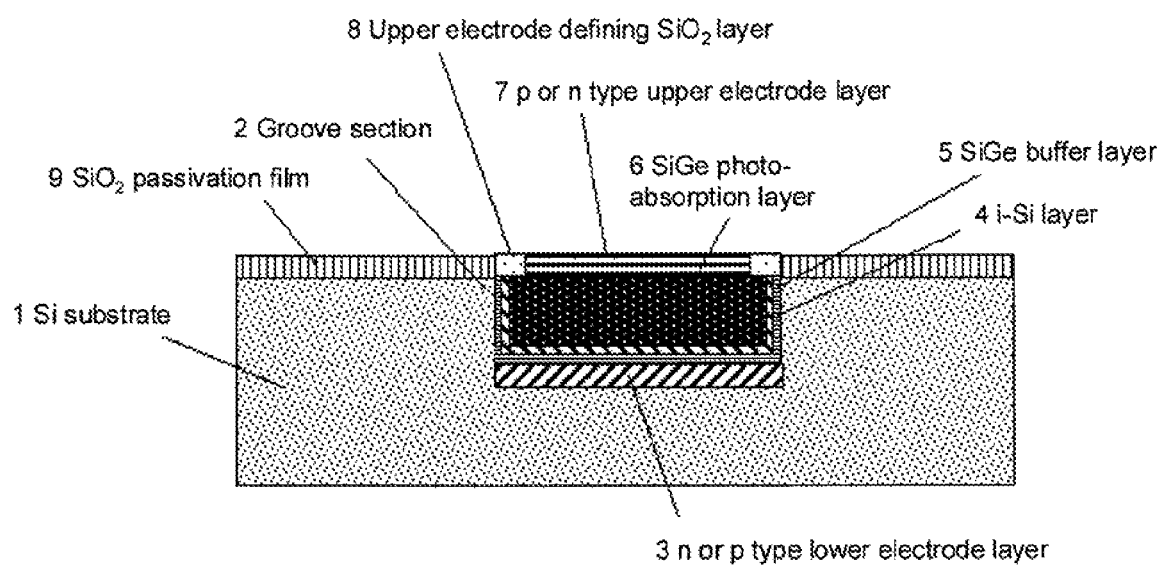
FIG. 1 is a sectional view schematically showing an example of a structure of a SiGe photodiode according to the first embodiment of the present invention, in which example according to the first embodiment a groove is formed in a part of a Si layer and a $Si_{1-x}Ge_x$ semiconductor absorption layer is formed in the groove, wherein a Si intrinsic semiconductor layer and a SiGe buffer layer are formed on a lower section and the side wall of the groove.

1 Si substrate
2 Groove section
3 n-type or p-type lower electrode layer
4 i-Si layer
5 SiGe buffer layer
6 SiGe photo-absorption layer
7 p-type or n-type upper electrode layer
8 Upper electrode defining $SiO_2$ film
9 $SiO_2$ passivation film
10 Upper clad layer
11 Embedded oxide layer
12 Si supporting substrate
13 Si waveguide core layer
14 Polycrystalline Si bridge
15 Metal electrode layer
16 SOI layer
17 $SiN_x$ mask
18 $SiO_2$ oxide layer
19 $n^+$ doped layer
20 Electrode defining $SiO_2$ mask
21 Optical fiber
22 Optical signal
23 Photodiode according to the present invention
24 Module housing
25 Electrical wiring
26 Preamplifier IC
27 Chip carrier
28 VCSEL light source
29 Electrical wiring via for light source and modulation thereof.
30 Electrical wiring via for photodiode
31 LSI package
32 Electrical wiring layer for light source modulation
33 Electrical wiring layer for photodiode
34 Optical fiber for output signal
35 Optical fiber for input signal
36 LSI mounting board
37 Concave mirror
38 Photodiode/light source mounting board

BEST MODE FOR CARRYING OUT THE INVENTION

Preferred embodiments of a SiGe photodiode according to the present invention will be explained hereafter.

A basic structure of a SiGe photodiode according to the present invention is a p-i-n type photodiode which is composed of a $Si_xGe_{1-x}$ semiconductor absorption layer, an upper electrode layer provided on the upper face thereof, and a lower electrode layer provided under the rear face thereof. In such a case, a structure, in which the $Si_xGe_{1-x}$ semiconductor absorption layer is embedded in a groove formed in a part of a Si layer, is employed therein. In order to achieve such a structure, the following structure is selected, which comprising:

a p-type or n-type doped lower electrode layer formed in a lower section of the groove;

a layered structure composed of a Si intrinsic semiconductor layer and a SiGe buffer layer that are formed on a lower section and the side wall of the groove; the $Si_xGe_{1-x}$ semiconductor absorption layer having a rectangular shape or a reverse tapered shape, which is formed on the layered structure; and an n-type or p-type doped upper electrode layer formed in an upper section of the groove.

In order to employ the aforementioned structure, the photodiode is used in the form of a side-surface incident p-i-n type photodiode, in which incidence of light is made through the wall surface of the $Si_xGe_{1-x}$ semiconductor absorption layer, instead of a surface incident p-i-n type photodiode in which incidence of light into the semiconductor absorption layer is made through the plane direction of the upper electrode layer or the lower electrode layer.

That is, the optical signal propagating in the Si layer is made to transmit through the layered structure composed of the Si intrinsic semiconductor layer and the SiGe buffer layer which are formed so as to cover the bottom surface and the side wall surface of the $Si_xGe_{1-x}$ semiconductor absorption layer, and is made incident into the $Si_xGe_{1-x}$ semiconductor absorption layer. In such a case, the incident optical signal is absorbed by the $Si_xGe_{1-x}$ semiconductor absorption layer while propagating in the $Si_xGe_{1-x}$ semiconductor absorption layer in the direction parallel to the layer. On the other hand, the photo carriers generated by the photo-absorption travel toward the upper electrode layer and the lower electrode layer which are arranged on the upper and lower sides of the $Si_xGe_{1-x}$ semiconductor absorption layer. For this reason, even when the response speed is set high, the photo-detection sensitivity can be kept high by selecting the film thickness $d_i$ of the $Si_xGe_{1-x}$ semiconductor absorption layer to be 1 μm or less.

In particular, in the case where the $Si_xGe_{1-x}$ semiconductor absorption layer is formed in such a shape that it is embedded in the groove, when the $Si_xGe_{1-x}$ semiconductor absorption layer is grown by using, as an underlying layer, the layered structure composed of the Si intrinsic semiconductor layer and the SiGe buffer layer which are formed on the lower section and the side wall of the groove, a $Si_xGe_{1-x}$ seed layer is formed on the surface of the SiGe buffer layer. In the $Si_xGe_{1-x}$ semiconductor layer which is grown subsequently to the $Si_xGe_{1-x}$ seed layer, crystal defect or dislocation is reduced.

On the upper surface of the groove portion, the edge surface of the layered structure composed of the Si intrinsic semiconductor layer and the SiGe buffer layer, and also the edge surface of the $Si_xGe_{1-x}$ seed layer are exposed along the wall surface (outer periphery) of the groove section. The upper electrode layer is formed on the top surface of the $Si_xGe_{1-x}$ semiconductor absorption layer, which is exposed on the upper surface of the groove portion. In such a case, however, it is preferred that the upper electrode layer is not in direct contact with the edge surface of the $Si_xGe_{1-x}$ seed layer, which is exposed along the wall surface (outer periphery) of the groove portion. As the condition of the arrangement, the area size of the upper electrode layer $S_{upper-electrode\ layer}$, and the area size of the bottom surface $S_{bottom\ surface}$ of the $Si_xGe_{1-x}$ semiconductor absorption layer are selected so as to satisfy the relationship of $S_{bottom\ surface} > S_{upper-electrode\ layer}$. That is, it is more preferred that the upper electrode layer is in contact only with the $Si_xGe_{1-x}$ semiconductor layer which exists in the inner side of the edge surface region of the $Si_xGe_{1-x}$ seed layer exposed along the wall surface (outer periphery) of the groove portion.

The SiGe photodiode according to the present invention is used as a side surface incident p-i-n type photodiode, and hence it is more preferred that the p-i-n type photodiode is produced in the form of being optically connected with a Si waveguide. In such a case, it is preferred that, when the $Si_xGe_{1-x}$ semiconductor absorption layer is optically connected with the Si waveguide via the layered structure composed of the Si intrinsic semiconductor layer and the SiGe buffer layer, the impedance matching is effected at the optical connection portion.

For example, the Si waveguide has a structure in which a clad layer is provided around a Si waveguide core section. The SiGe photodiode according to the present invention has a structure of being embedded in the groove which is formed in a part of the Si waveguide core section. In such a case, a transparent insulating film, for example a $SiO_2$ film, which functions as the upper clad layer, is also used as a passivation film.

The upper electrode layer is electrically connected to an upper metal electrode layer, and the SiGe photodiode is used in the state where electrical wiring is connected to the upper metal electrode layer. When the transparent insulating film, for example, $SiO_2$ film, is formed as the passivation film so as to also cover the upper electrode layer of the SiGe photodiode according to the present invention, it is possible to construct it in such a structure that the electrical connection between the upper electrode layer and the upper metal electrode layer is effected by a bridge structure made of polycrystalline Si.

For example, the bridge structure made of polycrystalline Si is composed of a polycrystalline Si bridge array, and the polycrystalline Si bridge array has a structure in which a plurality of polycrystalline Si bridges are periodically arranged. Thus, it is also possible to construct it in such a structure that the wavelength range is selected by the periodic structure.

As described above, the SiGe photodiode according to the present invention is formed to have a structure of being embedded in the groove formed in the Si layer. Therefore, the Si layer used to produce the SiGe photodiode according to the present invention can also be arranged as a part of a Si substrate in which the other semiconductor elements are produced. With the use of this feature, it is possible to construct an optical wiring system on an LSI, in which system the SiGe photodiode according to the present invention is provided in the photo-detection section therefor. Alternatively, it is also possible to construct an optical interconnection module comprising a Si substrate in which the SiGe photodiode according to the present invention is formed, and an LSI electronic circuit which is formed on the Si substrate monolithically with the SiGe photodiode.

The SiGe photodiode according to the present invention is produced in such a form in which it is embedded in the groove formed in the Si layer, and is preferably used as a side surface incident p-i-n type photodiode to receive an optical signal that is propagating in the Si layer. In other words, it is preferred that the SiGe photodiode according to the present invention is used in a wavelength band in which any attenuation of the optical signal is not caused by the absorption in the Si layer in the course where the optical signal is propagating in the Si layer to be made incident into the $Si_xGe_{1-x}$ semiconductor absorption layer. Therefore, it is preferred that the SiGe photodiode according to the present invention is used to receive the light having a wavelength which has photon energy smaller than the band gap of Si, Eg (Si). That is, it is preferred that the SiGe photodiode according to the present invention is used to receive an optical signal in the near infrared regions, such as the 1.3 μm band and the 1.55 μm band.

In such a case, the composition of the $Si_xGe_{1-x}$ semiconductor absorption layer is designed based on the light wavelength to be used. Specifically, it is preferred to select the composition of the $Si_xGe_{1-x}$ semiconductor absorption layer so that the direct transition band gap Eg (Γ) of the $Si_xGe_{1-x}$ semiconductor absorption layer is smaller than the energy of light to be received. For example, when the SiGe photodiode according to the present invention is used to receive an optical signal having a wavelength of 1550 nm, the composition of the $Si_xGe_{1-x}$ semiconductor absorption layer is selected in a range close to pure Ge, that is, the Ge composition (1−x) thereof is selected in the range of $1-x \geq 0.7$, preferably in the range of $1-x \geq 0.9$, and more preferably in the range of $1-x \geq 0.95$.

Since the $Si_xGe_{1-x}$ semiconductor absorption layer is used as the i-layer in the p-i-n type photodiode, it is more preferred that, when the intrinsic carrier concentration $n_i = 2.40 \times 10^{13}$ cm$^{-3}$ is taken as the reference concentration, the residual impurity concentration contained therein is 10 times or less than the reference concentration.

Therefore, it is preferred that the $Si_xGe_{1-x}$ semiconductor absorption layer is a non-doped layer. It is preferred that the residual impurity concentration contained in the $Si_xGe_{1-x}$ semiconductor absorption layer is at least such a low concentration as $1 \times 10^{16}$ cm$^{-3}$ or less.

More specific explanation about the structure of the SiGe photodiode according to the present invention is made hereafter.

FIG. 1 is a sectional view schematically showing the structure of the SiGe photodiode according to the first embodiment of the present invention. In the first embodiment, a Si substrate 1 is employed as a Si layer in which a groove is formed.

A groove section 2 is formed in a part of the upper surface of the Si substrate 1. An n-type or p-type doped lower electrode layer 3 is formed as a lower electrode layer in a lower section of the groove. A layered structure that is formed by laminating a Si intrinsic semiconductor layer 4 and a SiGe buffer layer 5 is provided so as to cover the lower section and the side wall of the groove section 2. A $Si_xGe_{1-x}$ semiconductor absorption layer 6 is formed on the layered structure, that is, on the SiGe buffer layer 5. The $Si_xGe_{1-x}$ semiconductor absorption layer 6 is formed so as to be embedded in the groove, and thus, the shape thereof is selected as a rectangular shape or a reverse tapered shape in dependence upon the shape of the groove section 2. In an upper section of the groove section 2, a p-type or n-type doped lower electrode layer 4 is formed as an upper electrode layer on the surface of the $Si_xGe_{1-x}$ semiconductor absorption layer 6 formed in the shape to be embedded in the groove.

In such a case, the upper electrode layer is formed on the top surface of the $Si_xGe_{1-x}$ semiconductor absorption layer 6, but the area size of the upper electrode layer $S_{upper\text{-}electrode\ layer}$ is set smaller than the area size of the top surface $S_{top\ surface}$ of the $Si_xGe_{1-x}$ semiconductor absorption layer 6. Since the shape of the $Si_xGe_{1-x}$ semiconductor absorption layer 6 is selected as the rectangular shape or the reverse tapered shape, the area size of the top surface $S_{top\ surface}$ and the area size of the bottom surface $S_{bottom\ surface}$ of the $Si_xGe_{1-x}$ semiconductor absorption layer 6 satisfy the condition of $S_{top\ surface} \geq S_{bottom\ surface}$.

In the SiGe photodiode according to the first embodiment of the present invention shown in FIG. 1, the area size of the upper electrode layer $S_{upper\text{-}electrode\ layer}$ is selected with respect to the area size of the top surface $S_{top\ surface}$ and the area size of the bottom surface $S_{bottom\ surface}$ of the $Si_xGe_{1-x}$ semiconductor absorption layer 6 so as to satisfy the condition of $S_{top\ surface} \geq S_{bottom\ surface} > S_{upper\text{-}electrode\ layer}$. An upper electrode defining $SiO_2$ film 8 is formed in an upper section of the groove so as to define the planar shape and the area size of the upper electrode layer. The upper electrode defining $SiO_2$ film 8 is formed into a shape which surrounds the periphery of the planar shape of the upper electrode layer along the planar shape. The upper electrode defining $SiO_2$ film 8 is formed so as to cover the edge surface which is located at the end of the layered structure formed by laminating the Si intrinsic semiconductor layer 4 and the SiGe buffer layer 5, and which is exposed at the upper section of the groove. As a result, in the upper section of the groove, the top surface of the $Si_xGe_{1-x}$ semiconductor absorption layer 6, and the edge surface of the layered structure formed by laminating the Si intrinsic semiconductor layer 4 and the SiGe buffer layer 5, are covered by the upper electrode defining $SiO_2$ film 8 and the upper electrode layer.

The upper surface of the Si substrate 1, in which the groove is provided, is covered by a $SiO_2$ passivation film 9 with the exception of the upper section of the groove section 2.

The upper electrode layer and the lower electrode layer are formed by combining electrode layers each having a different conductivity type, that is, by combining a p-type electrode layer and an n-type electrode layer, or by combining an n-type electrode layer and a p-type electrode layer. On the other hand, the $Si_xGe_{1-x}$ semiconductor absorption layer 6 is formed of i-$Si_xGe_{1-x}$ semiconductor. Therefore, the diode having the structure of being embedded in the groove section 2 is constructed as a p-i-n type photodiode. When a reverse bias voltage $V_R$ is applied between the upper electrode layer and the lower electrode layer, the photo-carriers, i.e. electrons and holes, which are generated in the $Si_xGe_{1-x}$ semiconductor absorption layer 6, are drifted respectively toward the n-type electrode layer and the p-type electrode layer.

When reaching the lower electrode layer, the carriers are taken out to external electrical wiring through the Si substrate 1, for example, through a lower metal electrode provided on the rear surface of the Si substrate 1. Therefore, the conductive type of the lower electrode layer is selected to be the same as the conductive type of the Si substrate 1.

Therefore, when the lower electrode layer is the n-type electrode layer, an n-type conductive Si substrate is employed as the Si substrate 1. When the lower electrode layer is the p-type electrode layer, a p-type conductive Si substrate is employed as the Si substrate 1.

For example, when the lower electrode layer is the n-type electrode layer, the donor concentration $N_{Dlower\text{-}electrode\ layer}$ in the lower electrode layer is selected preferably at least in the range of $N_{Dlower\text{-}electrode\ layer} \geq 2 \times 10^{17}$ cm$^{-3}$, and more preferably in the range of $N_{Dlower\text{-}electrode\ layer} \geq 5 \times 10^{17}$ cm$^{-3}$. In such a case, an n-type conductive Si substrate is employed as the Si substrate 1, but the donor concentration $N_{DSi\ layer}$ thereof is preferably selected in the range of $1/50 \cdot N_{Dlower\text{-}electrode\ layer} \geq N_{DSi\ layer}$. For example, when the donor concentration $N_{DSi\ layer}$ is selected in the range of $N_{Dlower\text{-}electrode\ layer} \geq 5 \times 10^{15}$ cm$^{-3}$, the donor concentration $N_{DSi\ layer}$ is preferably selected in the range of $1 \times 10^{15}$ cm$^{-3}$ to $1 \times 10^{16}$ cm$^{-3}$.

A recessed section used as the groove section 2 is formed by a method in which an etching mask is used to etch the surface of the Si substrate 1 that is exposed by the opening section of the mask.

When the shape of the groove section 2 is formed into a rectangle, it is preferred to select an etching method in which the pattern shape of the opening section of the mask is maintained, and a uniform etching depth is attained. That is, it is preferred that an etching method having high anisotropy in which the etching is not substantially performed in the direction of the wall surface of the recessed section is used rather than the isotropic etching method in which the etching is performed equivalently also in the direction of the wall surface of the recessed section For example, a reactive ion etching method can be used.

The lower electrode layer, which is formed in the lower section of the groove section 2, is formed in such a manner that, after the recessed section used as the groove section 2 is formed, $N^+$ doping or $P^+$ doping is performed to the Si substrate 1 exposed at the bottom section of the recessed section. Since it is necessary to employ a doping method in which the wall surface of the groove section 2 is not doped, an ion implantation method is usually used. When activation treatment of the implanted impurities are carried out after the ion implantation, the side wall surface and the bottom surface of the groove section 2 are protected by covering with a thin oxide film, and then, a heat treatment is performed. For this purpose, it is preferred that, after a thin thermally oxidized film or a thin water vapor oxide film is formed on the bottom surface and the side wall surface of the recessed section, ion implantation and activation annealing is carried out. The thermally oxidized film or the water vapor oxide film, which are used for the protection by covering therewith, is selectively etched off after the activation annealing, resulting in the groove section 2 in which the clean Si surface is also exposed on the side wall surface of the groove section 2.

In the state where the clean Si surface is exposed not only on the bottom surface but also on the side wall surface, the i-Si layer and the SiGe buffer layer are grown on the Si surface. In such a case, the layers need to be uniformly grown also on the side wall surface, and hence it is preferred to use, for example, a UHV-CVD method.

It is preferred that the etching mask used to form the recessed section is also used as a mask for selective growth at the step of growing the layers in the groove section 2. For example, it is preferred to use an etching mask using a $SiN_x$ film.

It is preferred that the Si composition $x_{buffer}$ of the SiGe buffer layer is selected in the range of $1 > x_{buffer} > x$, for example, selected to about $(1+x)/2$, with respect to the Si composition x of the $Si_xGe_{1-x}$ semiconductor absorption layer. In the case where $1-x \geq 0.70$, it is preferred that the Si composition $x_{buffer}$ of the SiGe buffer layer is selected to be as high as 0.5.

In the structure according to the present invention, the i-Si layer and the SiGe buffer layer are formed in the shape of layered structure so as to cover the whole part of the bottom section and the side wall surface of the groove section 2. Therefore, the $Si_xGe_{1-x}$ semiconductor absorption layer is grown not only on the bottom section of the groove section but also on the side wall surface of the groove section. Thereby, the exposure of the side surface of the facet that is formed in the case of the growth using the $SiO_2$ film as a mask can be suppressed, so that a junction structure with low leakage current can be formed.

In the structure according to the present invention, the junction size of the upper electrode layer is set smaller than the size of the lower section of the $Si_xGe_{1-x}$ semiconductor absorption layer so as to prevent the end section of the $Si_xGe_{1-x}$ semiconductor absorption layer from overlapping with the upper electrode layer. When this structure is selected, it is possible to avoid the state where an electric field is applied along the layer surface of the SiGe buffer layer formed on the side wall surface, which has a comparatively high dislocation density. Thus, it is possible to reduce the leakage current caused by the dislocation which exists in the SiGe buffer layer formed on the side wall surface.

Figure 2:
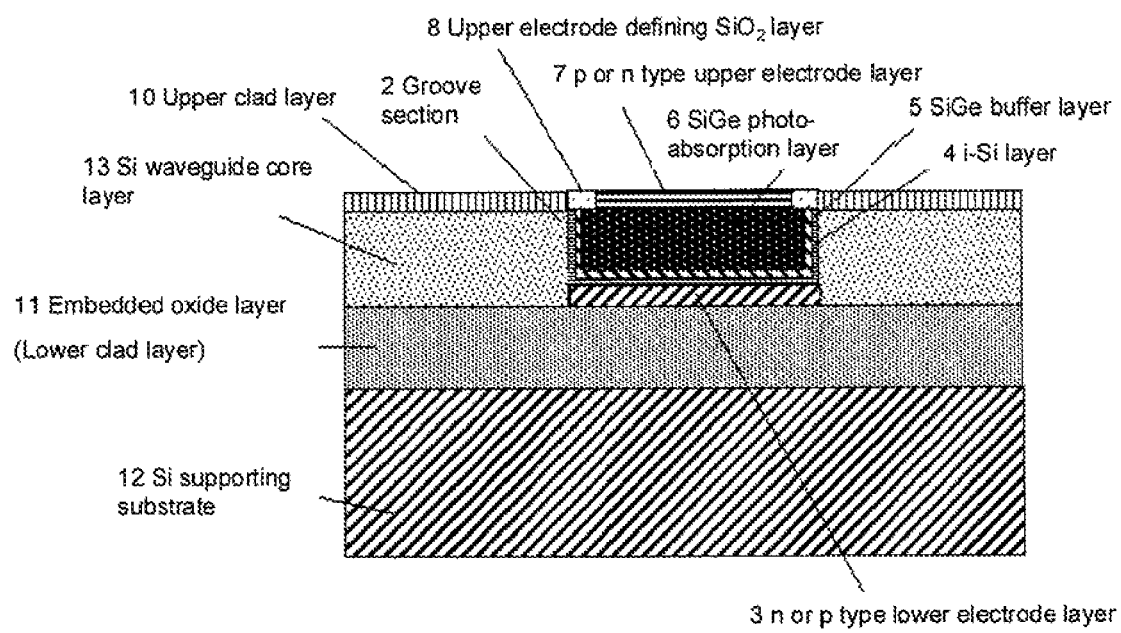
FIG. 2 is a sectional view schematically showing an example of a structure of a SiGe photodiode according to the second embodiment of the present invention, in which example according to the second embodiment a groove is formed in a part of a Si waveguide, and a $Si_{1-x}Ge_x$ semiconductor absorption layer is formed in the groove, wherein a Si intrinsic semiconductor layer and a SiGe buffer layer are formed on a lower section and the side wall of the groove.

FIG. 2 is a sectional view schematically showing a structure of a SiGe photodiode according to the second embodiment of the present invention. In the second embodiment, a Si waveguide core layer 13 that composes a Si waveguide is employed as the Si layer in which the groove is formed.

The Si waveguide is produced by using an SOI (Silicon-on-Insulator) formed on a Si supporting substrate 12. Therefore, it is produced by using the Si layer formed on the underlying insulating film, that is, the oxide film, which composes the SOI structure. In the Si waveguide, the underlying insulating film, that is, the oxide film, is used as a lower clad layer which is provided under the Si waveguide core layer 13. At the same time, the underlying insulating film, that is, the oxide film, is used as an embedded oxide layer 11 in the SiGe photodiode according to the second embodiment of the present invention.

Further, in the Si waveguide, the $SiO_2$ passivation film 9 formed so as to cover the surface of the Si layer is used as an upper clad layer 10 which is provided so as to cover the Si waveguide core layer 13.

The peak of the mode field of an optical signal propagating in the Si waveguide is located within the layer of the Si waveguide core layer 13. Therefore, the SiGe photodiode according to the second embodiment of the present invention is set in the state where the $Si_xGe_{1-x}$ semiconductor absorption layer is butt-connected to the core of the Si waveguide, and thereby, highly efficient photo-detection sensitivity performance can be attained.

In such a case, a layered structure composed of a i-Si layer and a SiGe buffer layer is inserted into the interface between the Si waveguide core layer 13 and the $Si_xGe_{1-x}$ semiconductor absorption layer. The change of refractive index is provided at the interface between the i-Si layer 4 and the SiGe buffer layer 5, and at the interface between the SiGe buffer layer 5 and the $Si_xGe_{1-x}$ semiconductor absorption layer. Thus, reflection is caused at each of the interfaces. It is also possible to reduce the reflectance at the interfaces by optimizing combination of the film thicknesses of the i-Si layer and the SiGe buffer layer so as to effect optical impedance matching. That is, it is also possible to further improve the efficiency of the optical coupling between the optical waveguide and the $Si_xGe_{1-x}$ semiconductor absorption layer.

When reaching the lower electrode layer, the carriers are taken out to external electrical wiring through the Si waveguide core layer 13, for example, through a lower metal electrode which is provided at the end section of the Si waveguide core layer 13. Therefore, the conductive type of the lower electrode layer is selected to be the same as the conductive type of the Si waveguide core layer 13.

Therefore, in the case when the lower electrode layer is an n-type electrode layer, an n-type conductive Si layer is employed as the Si waveguide core layer 13. In the case when the lower electrode layer is a p-type electrode layer, a p-type conductive Si layer is employed as the Si waveguide core layer 13.

For example, when the lower electrode layer is an n-type electrode layer, the donor concentration $N_{Dlower\text{-}electrode\ layer}$ doped in the lower electrode layer is preferably selected at least in the range of $N_{Dlower\text{-}electrode\ layer} \geq 2 \times 10^{17}\ cm^{-3}$, and is more preferably selected in the range of $N_{Dlower\text{-}electrode\ layer} \geq 5 \times 10^{17}\ cm^{-3}$. In such a case, an n-type conductive Si layer is employed as the Si waveguide core layer 13, but the donor concentration $N_{DSi\ layer}$ is preferably selected in the range of $1/50 \cdot N_{Dlower\text{-}electrode\ layer} \geq N_{DSi\ layer}$.

For example, when the donor concentration $N_{Dlower\text{-}electrode\ layer}$ is selected in the range of $N_{Dlower\text{-}electrode\ layer} \geq 5 \times 10\ cm^{-3}$, it s preferred that the donor concentration $N_{DSi\ layer}$ is selected in the range of $1 \times 10^{15}\ cm^{-3}$ to $1 \times 10^{16}\ cm^{-3}$.

Figure 3:
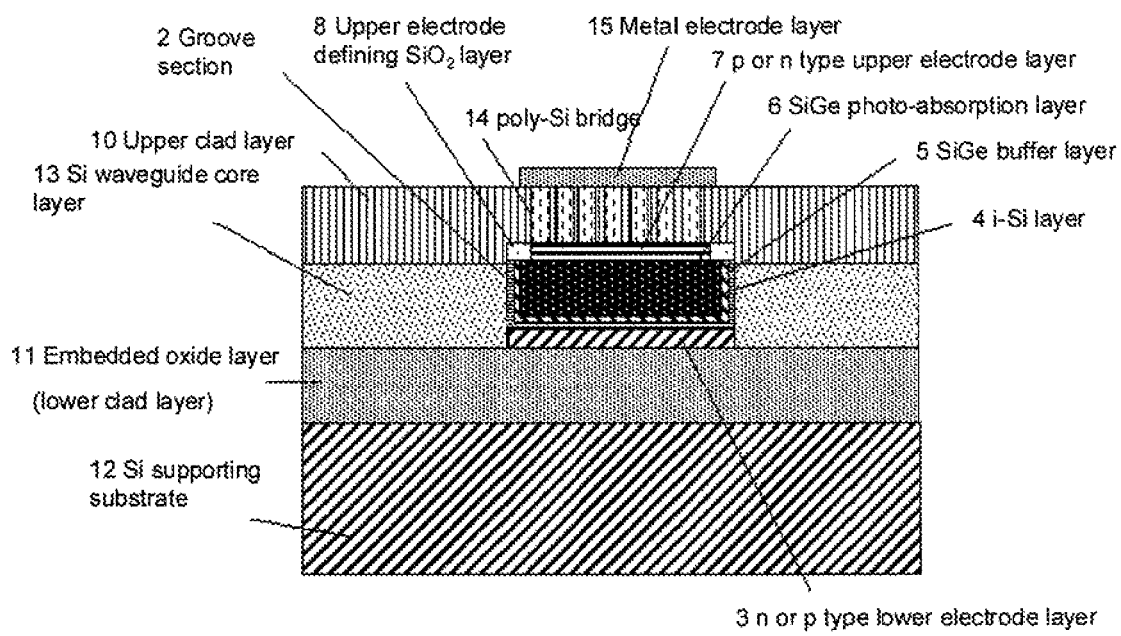
FIG. 3 is a sectional view schematically showing an example of a structure of a SiGe photodiode according to the third embodiment of the present invention, in which example according to the third embodiment a groove is formed in a part of a Si waveguide, and a $Si_{1-x}Ge_x$ semiconductor absorption layer is formed in the groove, wherein a Si intrinsic semiconductor layer and a SiGe buffer layer are formed on a lower section and the side wall of the groove; and further, a bridge structure made of polycrystalline Si that is used to extract an electrode is formed thereabove.

FIG. 3 is a sectional view schematically showing a structure of a SiGe photodiode according to the third embodiment of the present invention. Also in the third embodiment, the Si waveguide core layer 13 that composes the Si waveguide is employed as the Si layer in which the groove is formed.

In the structure of the second embodiment illustrated in FIG. 2, there is considerable difference between the film thickness $d_{lower\text{-}clad}$ of the lower clad layer (embedded oxide layer 11) that composes the Si waveguide and the film thickness $d_{upper\text{-}clad}$ of the upper clad layer 10 ($SiO_2$ passivation Film 9) that composes the Si waveguide. For this reason, the peak of the mode field of the optical signal propagating in the Si waveguide is considerably deviated from the layer center of the Si waveguide core layer 13.

On the contrary, in the structure of the third embodiment illustrated in FIG. 3, the peak of the mode field of the optical signal propagating in the Si waveguide is adjusted by properly selecting the film-thickness $d_{upper\text{-}clad}$ of the upper clad layer 10 ($SiO_2$ passivation film 9) that composes the Si waveguide with respect to the film thickness $d_{lower\text{-}clad}$ of the lower clad layer (embedded oxide layer 11) that composes the Si waveguide. That is, the peak of the mode field of the optical signal propagating in the Si waveguide is adjusted so as to coincide with the central position of the $Si_xGe_{1-x}$ semiconductor absorption layer which is formed in the groove section 2 that is provided in the Si waveguide core layer 13.

The film-thickness $d_{upper\text{-}clad}$ of the upper clad layer 10 ($SiO_2$ passivation film 9) is selected to be relatively thick. Thus, a structure is employed, in which the upper electrode layer and the upper metal electrode that is provided on the surface of the upper clad layer 10 are connected to each other by a bridge structure made of polycrystalline Si.

Although there is a difference in refractive index between the polycrystalline Si and the $SiO_2$ passivation film 9, the change in the effective refractive index of the upper clad layer 10 covering the upper surface of the SiGe photodiode is decreased, as compared with the case where the upper metal electrode is formed directly on the upper surface of the upper electrode layer. Therefore, it is possible to lessen the deviation of the peak position of the mode field of the optical signal propagating in the region in which the SiGe photodiode is formed. That is, also while the optical signal passes through the SiGe photodiode, the state is maintained, in which the peak of the mode field of the optical signal propagating in the Si waveguide substantially coincide with the central position of the $Si_xGe_{1-x}$ semiconductor absorption layer which is formed in the groove section 2 provided in the Si waveguide core layer 13. As a result, it becomes possible to further improve the photo-detection efficiency.

Further, it is also possible that the bridge structure that is formed in the upper clad layer 10 is constructed in the shape that is composed of a plurality of bridges which are made of polycrystalline Si, in particular, in the shape of array structure in which each of bridges is periodically arranged. In such a case, there is a difference in refractive index between the polycrystalline Si and the $SiO_2$ passivation film 9, and hence a region, in which the effective refractive index is periodically changed, is formed by using the bridge array structure. The region, in which the effective refractive index is periodically changed, can be made to function as a grating. The function as the grating can be successfully used to adjust the wavelength range having photo-detection sensitivity.

Specific examples are illustrated below to explain the present invention in more detail. These specific examples are examples of the best modes according to the present invention, but the scope of the present invention is not limited by these specific examples.

(First Exemplary Embodiment)

The SiGe photodiode according to the first embodiment of the present invention will be explained in detail by taking, as a specific example, a SiGe photodiode of the first exemplary embodiment, which has a structure shown in FIG. 4.

Figure 4:
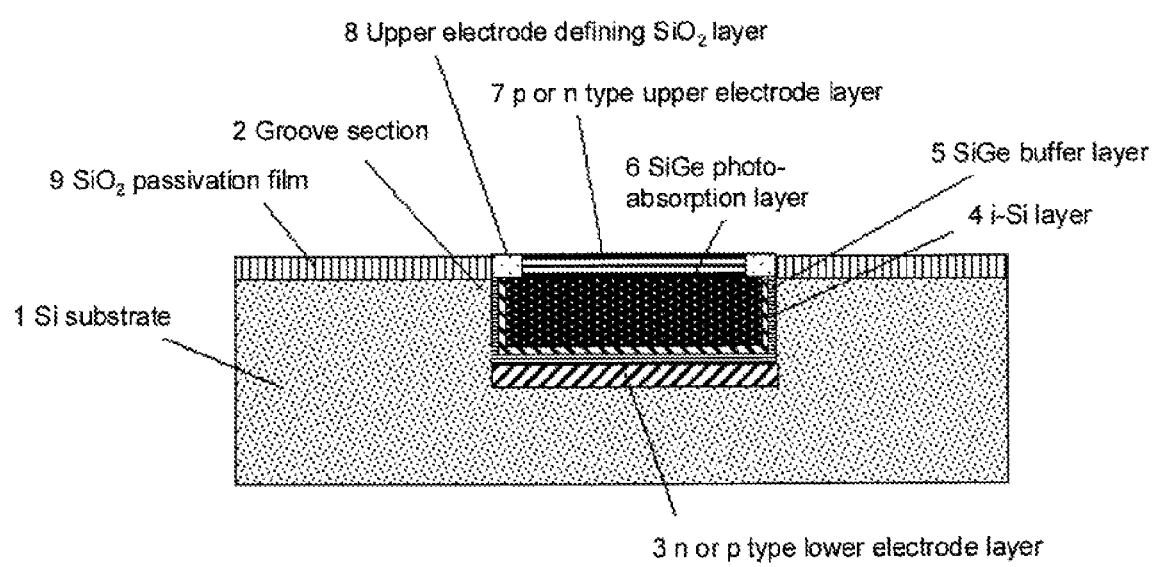
FIG. 4 is a sectional view schematically showing a structure of a SiGe photodiode of the first exemplary embodiment according to the present invention, in which a groove is formed in a part of a Si layer and a $Si_{1-x}Ge_x$ semiconductor absorption layer is formed in the groove, wherein a Si intrinsic semiconductor layer and a SiGe buffer layer are formed on a lower section and the side wall of the groove.

FIG. 4 is a sectional view schematically showing a structure of the SiGe photodiode of the first exemplary embodiment. The SiGe photodiode is produced so as to be embedded in a groove provided in a part of a Si layer. In the first exemplary embodiment, the Si substrate 1 is used as the Si layer.

The groove section 2 is formed in a part of the upper surface of the Si substrate 1. In the lower section of the groove, the n-type or p-type doped lower electrode layer 3 is formed as the lower electrode layer. The layered structure formed by laminating the Si intrinsic semiconductor layer 4 and the SiGe buffer layer 5 is provided so as to cover the lower section and the side wall of the groove section 2. The $Si_xGe_{1-x}$ semiconductor absorption layer 6 is formed on the layered structure, that is, on the SiGe buffer layer 5. The $Si_xGe_{1-x}$ semiconductor absorption layer 6 is formed so as to be embedded in the groove, and the shape thereof is selected from a rectangular shape or a reverse tapered shape in dependence upon the shape of the groove section 2. In the upper section of the groove section 2, the p-type or n-type doped lower electrode layer 4 is formed, as the upper electrode layer, on the surface of the $Si_xGe_{1-x}$ semiconductor absorption layer 6 that is formed in the shape to be embedded in the groove.

In such a case, the upper electrode layer is formed on the top surface of the $Si_xGe_{1-x}$ semiconductor absorption layer 6, but the area size $S_{upper\text{-}electrode\ layer}$ of the upper electrode layer is set smaller than the area size of the top surface $S_{top\ surface}$ of the $Si_xGe_{1-x}$ semiconductor absorption layer 6. The shape of the $Si_xGe_{1-x}$ semiconductor absorption layer 6 is selected to be the rectangular shape or the reverse tapered shape, and hence the area size of the top surface $S_{top\ surface}$ and the area size of the bottom surface $S_{bottom\ surface}$ of the $Si_xGe_{1-x}$ semiconductor absorption layer 6 satisfy the condition of $S_{top\ surface} \geq S_{bottom\ surface}$.

In the SiGe photodiode of the first exemplary embodiment shown in FIG. 4, the area size $S_{upper\text{-}electrode\ layer}$ of the upper electrode layer is selected, with respect to the area size of the top surface $S_{top\ surface}$ and the area size of the bottom surface $S_{bottom\ surface}$ of the $Si_xGe_{1-x}$ semiconductor absorption layer 6, so as to satisfy the condition of $S_{top\ surface} \geq S_{bottom surface} \geq S_{upper\text{-}electrode\ layer}$. The upper electrode defining $SiO_2$ film 8 is formed in the upper section of the groove so as to define the planar shape and the area size of the upper electrode layer. The upper electrode defining $SiO_2$ film 8 is formed into a shape which surrounds the periphery of the planar shape of the upper electrode layer along the planar shape. Further, the upper electrode defining $SiO_2$ film 8 is formed so as to cover the edge surface which is located at the end of the layered structure formed by laminating the Si intrinsic semiconductor layer 4 and the SiGe buffer layer 5, and which is exposed at the upper section of the groove. As a result, in the upper section of the groove, the top surface of the $Si_xGe_{1-x}$ semiconductor absorption layer 6, and the edge surface of the layered structure formed by laminating the Si intrinsic semiconductor layer 4 and the SiGe buffer layer 5, are covered by the upper electrode defining $SiO_2$ film 8 and the upper electrode layer.

The upper surface of the Si substrate 1, in which the groove is provided, is covered by the SiO$_2$ passivation film 9 with the exception of the upper section of the groove section 2.

The upper electrode layer and the lower electrode layer are formed by combining electrode layers each having a different conductivity type, that is, by combining a p-type electrode layer and an n-type electrode layer, or by combining an n-type electrode layer and a p-type electrode layer. On the other hand, the Si$_x$Ge$_{1-x}$ semiconductor absorption layer 6 is formed of i-Si$_x$Ge$_{1-x}$ semiconductor. Therefore, the diode having the structure of being embedded in the groove section 2 is constructed as a p-i-n type photodiode. When a reverse bias voltage $V_R$ is applied between the upper electrode layer and the lower electrode layer, the photo-carriers (electrons and holes) which are generated in the Si$_x$Ge$_{1-x}$ semiconductor absorption layer 6, are drifted respectively toward the n-type electrode layer and the p-type electrode layer.

As a specific example of the SiGe photodiode of the first exemplary embodiment shown in FIG. 4, an example (exemplary embodiment) of structure of a p-i-n type SiGe photodiode, in which a combination of a p-type upper electrode layer and an n-type lower electrode layer is selected as the upper electrode layer and the lower electrode layer, will be described below.

In the SiGe photodiode of the present exemplary embodiment, the groove section 2 is formed in the Si layer. The shape of the groove section 2 is selected such that the shape of the upper opening portion of the groove section 2 is a rectangle, and the shape of the vertical cross section of the groove section 2 is a rectangle. The upper opening section of the groove section 2 is set as the length $L_{top}$=10 μm and the width $W_{top}$=4.5 μm, and the depth of the groove section 2 is set as $d_{trench}$=200 nm. Therefore, the shape of the bottom section of the groove section 2 is set as a rectangle having the length $L_{bottom}$=10 μm and the width $W_{bottom}$=4.5 μm.

After the groove section 2 is formed in the Si layer, an n$^+$-Si layer is formed by performing n$^+$ doping to the bottom section of the groove section 2. In the n$^+$-Si layer, P is doped as a donor, and the donor concentration doped therein is selected as $N_{D-bottom}$=5×10$^{18}$ cm$^{-3}$. The film thickness $d_{lower-electrode\ layer}$ of the n$^+$-Si layer is selected as $d_{lower-electrode\ layer}$=100 nm. The n$^+$-Si layer is used as the n-type lower electrode layer.

Then, on the n$^+$-Si layer and the side wall surface of the groove section 2, a i-Si layer and a Si$_{0.5}$Ge$_{0.5}$ buffer layer are formed in the shape of layered structure by the UHV-CVD method. The film thickness $d_{i-Si-bottom}$ of the i-Si layer is selected to be as thin as 10 to 50 nm, and the film thickness $d_{SiGe-buffer}$ of the Si$_{0.5}$Ge$_{0.5}$ buffer layer is selected to be as thin as 10 to 50 nm, respectively. In the formation of the i-Si layer and the Si$_{0.5}$Ge$_{0.5}$ buffer layer by the UHV-CVD method, Si$_2$H$_6$ and GeH$_4$ are used as the source gas of Si and Ge. Further, at the step of the growth, the pressure is selected to be 0.1 Pa, and the substrate temperature is selected to be 500° C.

Subsequently, the substrate temperature is selected to be as low as 300° C., so that a low-temperature growth Ge layer to be used as a seed layer is laminated on the Si$_{0.5}$Ge$_{0.5}$ buffer layer. The film thickness $d_{Ge-seed}$ of the Ge layer is selected to be 30 nm. The substrate temperature is set to as high as 550° C., so that a Ge layer is laminated on the Ge seed layer. The film thickness $d_{Ge}$ of the Ge layer is selected to be as thick as 200 nm to 500 nm. Finally, the i-Si layer is laminated on the Ge layer. The film thickness $d_{i-Si-top}$ of the i-Si layer is selected to be 50 nm.

A SiO$_2$ mask pattern is formed on the top surface of the i-Si layer, and then B is doped as an acceptor by the ion implantation method, so as to form a p$^+$ Si layer. The acceptor concentration in the p$^+$ Si layer is selected as $N_{A-top}$=1×10$^{20}$ cm$^{-3}$. The p$^+$ Si layer is used as the p-type upper electrode layer. In such a case, when the shape of the opening section of the SiO$_2$ mask pattern is set as a rectangle having the length $L_{mask-opening}$=9 μm and the width $W_{mask-opening}$=4 μm, the shape of the p$^+$ Si layer is formed into a rectangular shape having the length $d_{upper-electrodelayer}$=9 μm and the width $W_{upper-electrodelayer}$=4 μm. The film thickness $d_{upper-electrodelayer}$ of the p$^+$ Si layer is set as $d_{upper-electrode\ layer}$=50 nm.

The Ge seed layer and the Ge layer function as the Si$_x$Ge$_{1-x}$ semiconductor absorption layer. Therefore, the film thickness $d_i$ of the Si$_x$Ge$_{1-x}$ semiconductor absorption layer corresponds to $d_i$=$d_{Ge}$+$d_{Ge-seed}$. The shape of the lower section of the Si$_x$Ge$_{1-x}$ semiconductor absorption layer is a rectangular shape having the length $L_{i-bottom}$ and the width $W_{i-bottom}$. The length $L_{i-bottom}$ is set as $L_{i-bottom}$≈$L_{bottom}$−2($d_{i-Si-bottom}$+$d_{SiGe-buffer}$), and the width $W_{i-bottom}$ is set as $W_{i-bottom}$≈$W_{bottom}$−2($d_{i-Si-bottom}$+$d_{SiGe-buffer}$).

Therefore, the area size $S_{upper-electrode\ layer}$ of the upper electrode layer made of the p$^+$ Si layer is selected to be smaller than the area size of the lower section $S_{bottom\ surface}$ of the Si$_x$Ge$_{1-x}$ semiconductor absorption layer.

In the SiGe photodiode of the exemplary embodiment, a Ti/Al layer (having film thicknesses of 50 nm/200 nm) is provided as the upper metal electrode layer which is electrically connected to the upper electrode layer made of the p$^+$ Si layer. On the other hand, a Ti/Al layer (having film thicknesses of 50 nm/200 nm) is provided as the lower metal electrode layer which is connected via the Si layer to the lower electrode layer made of the n$^+$ Si layer. The upper metal electrode layer is provided directly on the surface of the upper electrode layer. On the other hand, the lower metal electrode layer is provided adjacent to the groove section 2 of the Si substrate 1 which is used as the Si layer. In the portion where the lower metal electrode layer is provided, a part of the Si substrate 1 is converted into n$^+$Si in order to reduce the contact resistance. At the time of operation, the upper metal electrode layer and the lower metal electrode layer are connected to the bias power source, so that the reverse bias voltage $V_R$ is applied between the metal electrode layers.

In the SiGe photodiode of the exemplary embodiment, when $V_R$=−1 V is applied as the reverse bias voltage $V_R$, the whole region of the Si$_x$Ge$_{1-x}$ semiconductor absorption layer is depleted. In such a case, the effective pin junction cross-sectional area size $S_{pin-junction}$ can be regarded as $S_{pin-junction}$≈$S_{bottom\ surface}$.

In the SiGe photodiode of the exemplary embodiment, in the case where the dark current $I_{dark}$ is measured at the time when $V_R$=−1 V is applied, the measured dark current density ($I_{dark}$/$S_{pin-junction}$) is in the range of 100 μA/cm$^2$ or less. Therefore, the pin type SiGe photodiode has good junction performance.

As described above, the layered structure formed by laminating the i-Si layer 4 and the SiGe buffer layer 5 is provided not only in the bottom section of the groove section 2 but also on the side wall surface of the groove section 2, and further, the Ge seed layer is laminated on the layered structure. As a result, the growth of Ge layer is initiated from the Ge seed layer laminated on the side wall surface, in addition to on the bottom section. That is, the side wall surface of the Si$_x$Ge$_{1-x}$ semiconductor absorption layer formed in the groove section 2 is embedded by being covered by the layered structure formed by laminating the i-Si layer 4 and the SiGe buffer layer 5.

When the Si$_x$Ge$_{1-x}$ semiconductor is selectively grown by using the SiO$_2$ film as a selective growth mask, the side surface of the facet is exposed. The state where the side surface of the facet is exposed becomes a cause of the surface leakage current. However, the exposure of the side surface of the facet can be avoided in the SiGe photodiode of the exemplary embodiment. As a result, it is possible to form a pin junction with low surface leakage current.

Furthermore, when, after the growth step for embedding the layer in the groove section 2 is ended, the Ge layer grown therein is subjected to an anneal treatment at such a high temperature as 550 to 700° C., the density of dislocation existing in the $Si_xGe_{1-x}$ semiconductor absorption layer is significantly improved. In the case if the temperature of 900° C. and the time of 30 minutes are selected as the conditions of the anneal treatment, the dark current density ($I_{dark}/S_{pin-junction}$) measured at the time of application of $V_R=-1$ V is in the range of 50 μA/cm² or less in the produced SiGe photodiode of the exemplary embodiment. Therefore, reduction in the dark current density ($I_{dark}/S_{pin-junction}$) is attained by applying the anneal treatment thereto.

In the SiGe photodiode of the first exemplary embodiment according to the present invention, the Si substrate is employed, as shown in FIG. 4, as the Si layer in which the groove section 2 is formed.

A Si layer formed on an insulating film, such as SOI (Silicon-on-Insulator), may also be employed as the Si layer in which the groove section 2 is formed. In such a case, a high resistance substrate having such a high specific resistance as 500 to 1000 Ωcm can be used as a supporting substrate on which the SOI (Silicon-on-Insulator), and the like, is produced. The parasitic electric capacitance of the electrode pad can be reduced by employing the Si layer, such as the SOI (Silicon-on-Insulator), which uses the high resistance substrate as the supporting substrate. By the reduction in the parasitic electric capacitance, it is possible to expand the frequency band-width $f_{3dm}$ of the p-i-n type SiGe photodiode to about 40 GHz.

Figure 5:
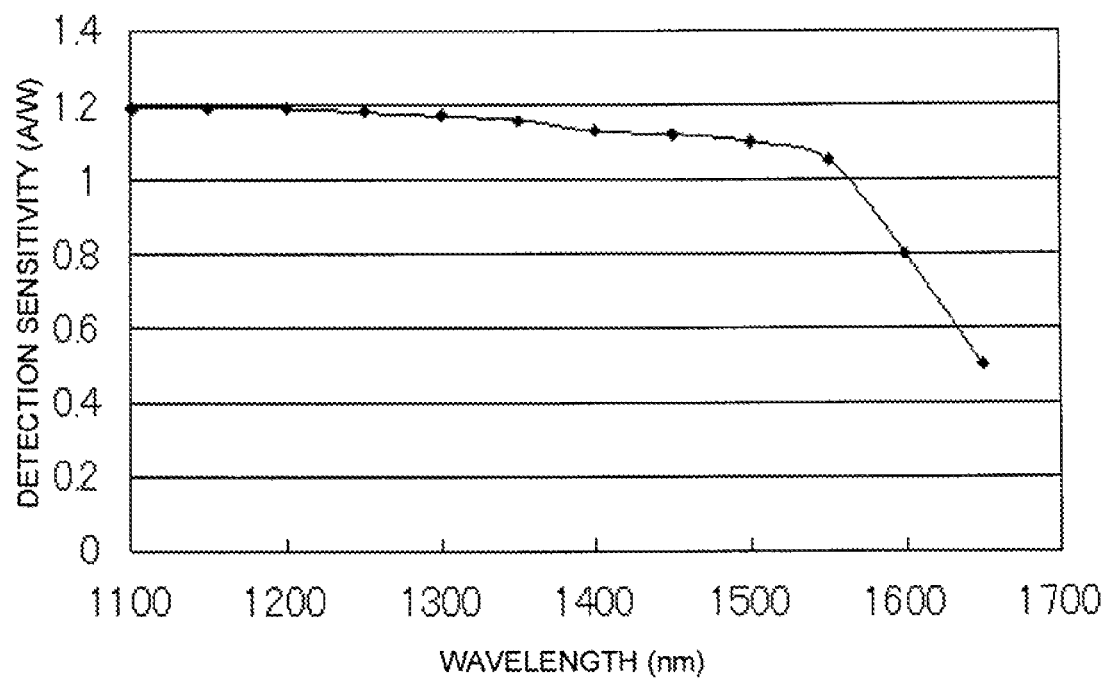
FIG. 5 shows an example of measurement of detection sensitivity spectrum of the SiGe photodiode of the first exemplary embodiment according to the present invention.

FIG. 5 shows an example of measurement of detection sensitivity spectrum of the SiGe photodiode of the first exemplary embodiment according to the present invention. The $Si_xGe_{1-x}$ semiconductor absorption layer, which is formed into the structure of being embedded in the groove section 2 provided in the Si layer, is adjacent to the Si layer at the side wall section and the bottom section of the groove section 2. Therefore, strain can be effectively introduced by the difference ($\beta_{SixGe1-x}-\beta_{Si}$) between the thermal expansion coefficient $\beta_{SixGe1-x}$ of the $Si_xGe_{1-x}$ semi-conductor and the thermal expansion coefficient Psi of Si. The direct transition band gap Eg (Γ) is reduced by the tensile distortion $\sigma_{tensile}$ introduced into the $Si_xGe_{1-x}$ semiconductor absorption layer, so that sufficiently high photo-detection sensitivity is attained also in 1550 nm band.

The measurement example shown in FIG. 5 is a result of the measurement performed by applying a bias of $V_R=-1$ V to the SiGe photodiode of the first exemplary embodiment in which the $Si_xGe_{1-x}$ semiconductor absorption layer is composed such that the Ge composition of $Si_xGe_{1-x}$ is set as 1−x=0.9, with the film thickness of $d_i=200$ nm, and the size of the bottom section of the length $L_{i-bottom}=10$ μm and the width $W_{i-bottom}=4.5$ μm. Note that the input of light to the SiGe photodiode is performed from the side surface direction with respect to the $Si_xGe_{1-x}$ semiconductor absorption layer. The photo-detection sensitivity at the incident light wavelength of λ=1550 nm (photon energy: 0.801 eV) is as high as 1.1 A/W. When the photo-detection sensitivity is converted to a quantum efficiency η, the efficiency η is close to 90%.

(Second Embodiment)

The SiGe photodiode according to the second embodiment of the present invention will be described in detail by taking, as a specific example, a SiGe photodiode of the second exemplary embodiment, which has a structure shown in FIG. 6.

Figure 6:
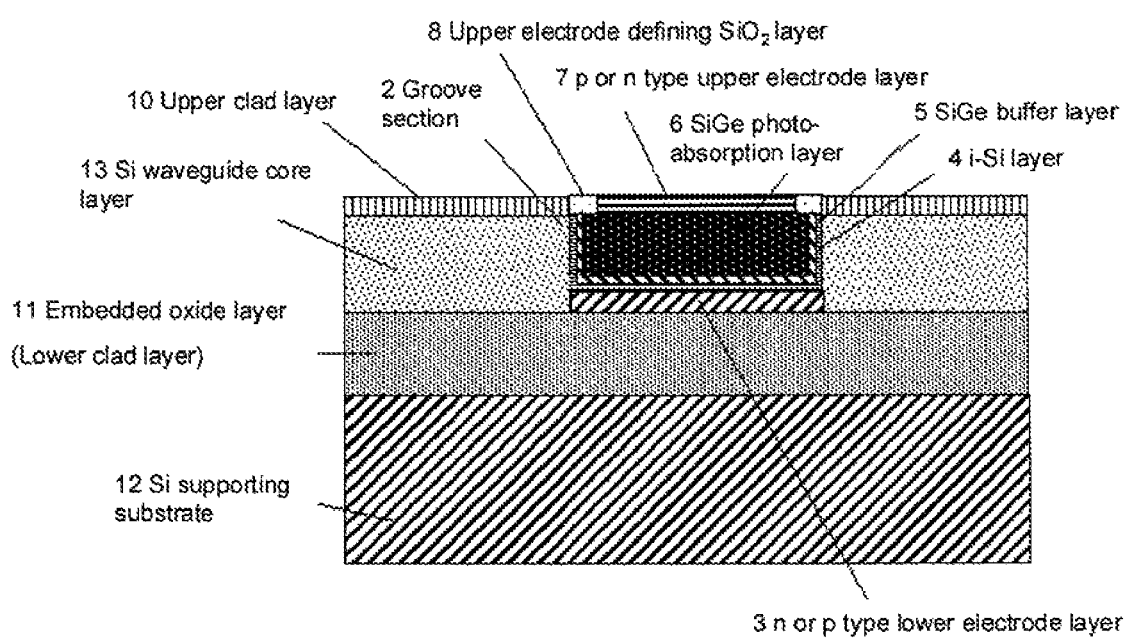
FIG. 6 is a sectional view schematically showing a structure of a SiGe photodiode of the second exemplary embodiment according to the present invention, in which a groove is formed in a part of a Si waveguide and a $Si_{1-x}Ge_x$ semiconductor absorption layer is formed in the groove, wherein a Si intrinsic semiconductor layer and a SiGe buffer layer are formed on a lower section and the side wall of the groove.

FIG. 6 is a sectional view schematically showing a structure of the SiGe photodiode of the second exemplary embodiment. The SiGe photodiode of the second exemplary embodiment is produced in the form of being embedded in a groove which is provided in a part of a Si waveguide that is formed by using an SOI substrate. The $Si_xGe_{1-x}$ semiconductor absorption layer is butt-connected to the Si waveguide, so that highly efficient photo-detection sensitivity performance can be obtained. In the second exemplary embodiment, the Si waveguide core layer 13 of the Si waveguide produced by using the SOI structure is used as the Si layer.

The groove section 2 is formed in a part of the upper surface of the Si waveguide core layer 13. In the lower section of the groove, the n-type or p-type doped lower electrode layer 3 is formed as the lower electrode layer. The layered structure formed by laminating the Si intrinsic semiconductor layer 4 and the SiGe buffer layer 5 is provided so as to cover the lower section and the side wall of the groove section 2. The $Si_xGe_{1-x}$ semiconductor absorption layer 6 is formed on the layered structure, that is, on the SiGe buffer layer 5. The $Si_xGe_{1-x}$ semiconductor absorption layer 6 is formed so as to be embedded in the groove. As the shape of the $Si_xGe_{1-x}$ semiconductor absorption layer 6, a rectangular shape or a reverse tapered shape is selected in dependence upon the shape of the groove section 2. In the upper section of the groove section 2, the p-type or n-type doped lower electrode layer 4 is formed, as the upper electrode layer, on the surface of the $Si_xGe_{1-x}$ semiconductor absorption layer 6 formed in the shape to be embedded in the groove.

In such a case, the upper electrode layer is formed on the top surface of the $Si_xGe_{1-x}$ semiconductor absorption layer 6, but the area size of the upper electrode layer $S_{upper-electrode\ layer}$ is set smaller than the area size of the top surface $S_{top\ surface}$ of the $Si_xGe_{1-x}$ semiconductor absorption layer 6. The shape of the $Si_xGe_{1-x}$ semiconductor absorption layer 6 is selected as a rectangular shape or a reverse tapered shape, and hence the area size of the top surface $S_{top\ surface}$ and the area size of the bottom surface $S_{bottom\ surface}$ of the $Si_xGe_{1-x}$ semiconductor absorption layer 6 satisfy the condition of $S_{top\ surface} \geqq S_{bottom\ surface}$.

In the SiGe photodiode of the second exemplary embodiment shown in FIG. 6, the area size of the upper electrode layer $S_{upper-electrode\ layer}$ is selected with respect to the area size of the top surface $S_{top\ surface}$ and the area size of the bottom surface $S_{bottom\ surface}$ of the $Si_xGe_{1-x}$ semiconductor absorption layer 6 so as to satisfy the conditions of $S_{top\ surface} \geqq S_{bottom\ surface} > S_{upper-electrode\ layer}$. The upper electrode defining $SiO_2$ film 8 is formed in the upper section of the groove so as to define the planar shape and the area size of the upper electrode layer. The upper electrode defining $SiO_2$ film 8 is formed into a shape to surround the periphery of the planar shape of the upper electrode layer along the planar shape. Further, the upper electrode defining $SiO_2$ film 8 is formed so as to cover the edge surface which is located at the end of the layered structure formed by laminating the Si intrinsic semiconductor layer 4 and the SiGe buffer layer 5, and which is exposed at the upper section of the groove. As a result, in the upper section of the groove, the top surface of the $Si_xGe_{1-x}$ semiconductor absorption layer 6, and the edge surface of the layered structure formed by laminating the Si intrinsic semiconductor layer 4 and the SiGe buffer layer 5 are covered by the upper electrode defining $SiO_2$ film 8 and the upper electrode layer.

The upper surface of the Si waveguide core layer 13, in which the groove section 2 is provided, is covered by the $SiO_2$ passivation film 9 with the exception of the upper section of the groove section 2. The $SiO_2$ passivation film 9 also covers both the side surfaces of the Si waveguide core layer 13.

The upper electrode layer and the lower electrode layer are formed by combining electrode layers each having a different conductivity type, that is, by combining a p-type electrode layer and an n-type electrode layer, or by combining an n-type electrode layer and a p-type electrode layer. On the other hand, the $Si_xGe_{1-x}$ semiconductor absorption layer 6 is formed of i-$Si_xGe_{1-x}$ semiconductor. Therefore, the diode having the structure embedded in the groove section 2 is constructed as a p-i-n type photodiode. When a reverse bias voltage $V_R$ is applied between the upper electrode layer and the lower electrode layer, the photo-carriers (electrons and holes) which are generated in the $Si_xGe_{1-x}$ semiconductor absorption layer 6, are drifted respectively toward the n-type electrode layer and the p-type electrode layer.

The lower layer insulating film that composes the SOI structure is a Si oxide layer, and is used as the lower clad layer of the Si waveguide. On the other hand, in the portion of the SiGe photodiode of the second exemplary embodiment, the lower layer insulating film functions as the embedded oxide layer 11 provided under the lower electrode layer. It is preferred that the film thickness $d_{lower-clad}$ of the embedded oxide layer 11 is selected in the range of $d_{lower-clad} \geq 0.5$ μm. That is, it need to be used to effect electrical separation and optical separation between the Si waveguide core layer 13 and the Si supporting substrate 12, and hence the film thickness said range is preferably selected in said range.

The Si waveguide core layer 13 is selected to have the core section size of the thickness $d_{si-core}$ and the width $W_{si-core}$. The size of the groove section 2 formed in a part of the Si waveguide core layer 13 is selected to correspond to the core section size. As for the shape of the groove section 2, the shape of the upper opening section of the groove section 2 is selected to be a rectangle, and the vertical sectional shape of the groove section 2 is selected to be a rectangle. When it is assumed that the upper opening section of the groove section 2 has a length $L_{top}$ and a width $W_{top}$, the width $W_{top}$ needs to satisfy the condition of $W_{top} < W_{si-core}$ with respect to the core section width $W_{si-core}$. It is preferred that the arrangement of the groove section 2 is selected so that the groove section 2 is positioned at the central portion of the core section. Further, it is preferred that the difference ($W_{si-core} - W_{top}$) between the width $W_{top}$ and the width $W_{si-core}$ of the core section satisfies the condition of ($W_{si-core} - W_{top}$) $\geq 0.1$ μm.

When the thickness of the lower electrode layer provided in the lower section of the groove section 3 is set as $d_{lower-electrode\ layer}$, and when the depth of the groove section 2 is set as $d_{trench}$, ($d_{trench} + d_{lower-electrode\ layer}$) needs to satisfy the condition of ($d_{trench} + d_{lower-electrode\ layer}$) $\leq d_{si-core}$. Preferably, the thickness of the lower electrode layer and the depth of the groove section 2 are selected to satisfy the condition of ($d_{trench} + d_{lower-electrode\ layer}$) = $d_{si-core}$.

Any of the channel-type and the rib-type waveguides can be selected as the Si waveguide. For example, when the rib-type Si waveguide is employed, etching processing is performed in correspondence with the difference ($d_{si-core} - d_{tail}$) between the thickness $d_{si-core}$ of the core section and the thickness $d_{tail}$ of the lower section of the rib. When the depth $d_{trench}$ of the groove section 2 is selected as $d_{trench} = (d_{si-core} - d_{tail})$, it is also possible to perform the etching step for forming the rib-type waveguide simultaneously with the etching step for forming the groove section 2.

The $SiO_2$ passivation film 9 covering the upper surface of the Si waveguide core layer 13 exhibits the function as the upper clad layer in dependence upon the film thickness of the $SiO_2$ passivation film 9. However, in the second exemplary embodiment employing the structure in which the upper surface of the groove section 2 is not covered therewith, the film thickness of the $SiO_2$ passivation film 9 $d_{sio2-passivation}$ is selected in the range of 2 μm $\geq d_{sio2-passivation} \geq 0.1$ μm. That is, the film thickness of the $SiO_2$ passivation film 9 is selected in the range in which it is possible to apply the method of protecting the upper surface of the groove section 2 by the resist mask to prevent the deposition of the $SiO_2$ passivation film 9 thereon.

The $Si_xGe_{1-x}$ semiconductor absorption layer is butt-connected to the Si waveguide, but the light propagating in the Si waveguide core layer 13 is incident on the $Si_xGe_{1-x}$ semiconductor absorption layer through the i-Si layer 4 and the SiGe buffer layer 5 which are formed on the side wall surface of the groove section 2. There is a change in the refractive index at the interface between the i-Si layer 4 and the SiGe buffer layer 5, and at the interface between the SiGe buffer layer 5 and the $Si_xGe_{1-x}$ semiconductor absorption layer, and hence reflection is caused at each of the interfaces. The reflectance at each of the interfaces can be reduced by optimizing the film thickness $d_{i-Si-bottom}$ of the i-Si layer 4, and the film thickness $d_{SiGe-buffer}$ of the SiGe buffer layer 5 so as to effect optical impedance matching at each of the interfaces.

For example, it is preferred that, when the specific refractive index of the SiGe buffer layer 5 is set as $n_{SiGe}$ with respect to the wavelength $\lambda_0$ of the incident light in the vacuum, the film thickness $d_{SiGe-buffer}$ of the SiGe buffer layer 5 is selected so as to satisfy the condition of $d_{SiGe-buffer} \cdot n_{SiGe} \approx 1/4 \cdot \lambda_0$. Note that the specific refractive index $n_{i-Si}$ of the i-Si layer 4 is substantially equal to the specific refractive index $n_{Si-core}$ of the Si waveguide core layer 13. Therefore, any reflection is hardly caused at the interface between the i-Si layer 4 and the Si waveguide core layer 13.

The $Si_xGe_{1-x}$ semiconductor absorption layer formed so as to be embedded in the Si waveguide core layer 13 woks as a light-absorbing inner core region provided in the Si waveguide core layer 13. There is achieved such condition that An outer core region composed of the SiGe buffer layer 5, the i-Si layer 4, and the Si waveguide core layer 13 is formed so as to surround the $Si_xGe_{1-x}$ semiconductor absorption layer which is the inner core region. It is possible to improve the optical coupling efficiency by optimizing the shape of the mode field and the light intensity distribution of the light propagating in this region. For example, on the bottom surface side of the groove section 2, the outer core region which is composed of the SiGe buffer layer 5, the i-Si layer 4 and the lower electrode layer 3, and further the embedded oxide layer 11 that is used as the lower clad layer exist under the inner core region of the $Si_xGe_{1-x}$ semiconductor absorption layer. It is preferred to optimize the sum ($d_{i-Si-bottom} + d_{lower-electrode\ layer}$) of the film thickness $d_{i-Si-bottom}$ of the i-Si layer 4 and the film thickness $d_{lower-electrode\ layer}$ of the lower electrode layer 3. The i-Si layer 4 can be regarded as a clad in the waveguide formed by using the $Si_{1-x}Ge_x$ semiconductor absorption layer as the waveguide core. Thus, it is preferred to optimize the film thickness of the i-Si layer 4 together with the film thickness of the lower electrode layer 3.

By optimizing the film thickness $d_{i-Si-bottom}$ of the i-Si layer 4, and the film thickness $d_{SiGe-buffer}$ of the SiGe buffer layer 5, it is possible to further improve the optical coupling efficiency between the Si waveguide core layer 13 and the $Si_xGe_{1-x}$ semiconductor absorption layer, so that the coupling loss of 1 dB or less can be attained.

(Third Embodiment)

The structure of the SiGe photodiode according to the third embodiment of the present invention will be described in detail by taking, as a specific example, a SiGe photodiode of the third exemplary embodiment according to the present invention, which has a structure shown in FIG. 7.

Figure 7:
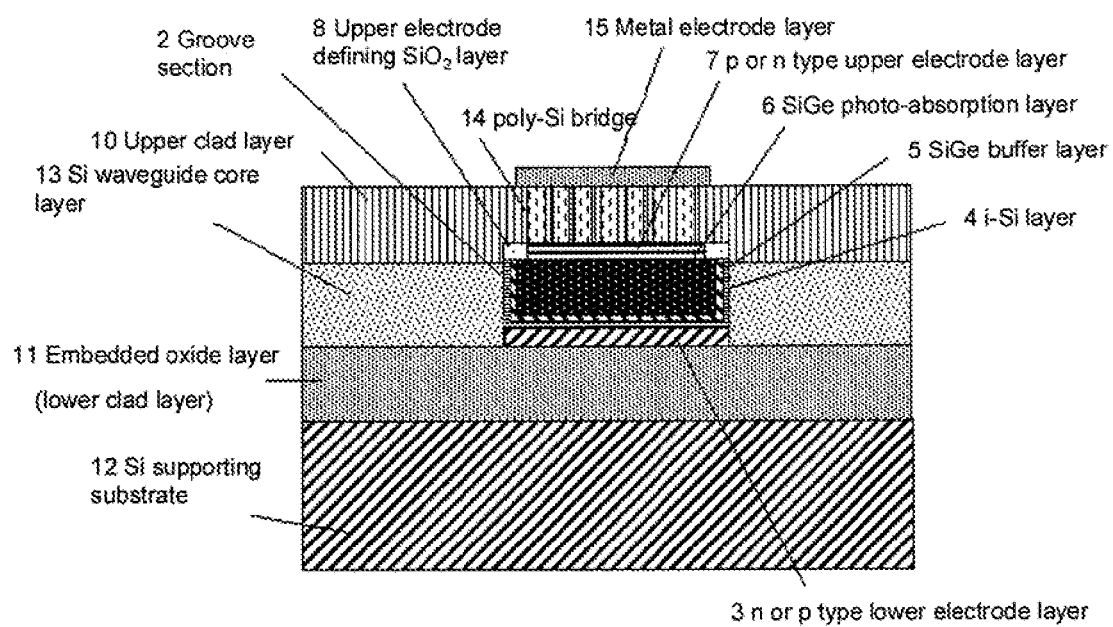
FIG. 7 is a sectional view schematically showing a structure of a SiGe photodiode of the third exemplary embodiment according to the present invention, in which a groove is formed in a part of a Si waveguide and a $Si_{1-x}Ge_x$ semiconductor absorption layer is formed in the groove, wherein a Si intrinsic semiconductor layer and a SiGe buffer layer are formed on a lower section and the side wall of the groove; and further, a bridge structure made of polycrystalline Si that is used to extract an electrode is formed thereabove.

FIG. 7 is a sectional view schematically showing a structure of the SiGe photodiode of the third exemplary embodiment. The SiGe photodiode of the third exemplary embodiment is produced in a form of being embedded in a groove which is provided in a part of a Si waveguide formed by using an SOI substrate. The $Si_xGe_{1-x}$ semiconductor absorption layer is butt-connected to the Si waveguide, so that highly efficient photo-detection sensitivity performance can be obtained. In the third exemplary embodiment, the Si waveguide core layer 13 of the Si waveguide produced by using the SOI structure is used as the Si layer.

In the SiGe photodiode of the third exemplary embodiment, the upper surface of the Si waveguide core layer 13, including the upper section of the groove section 2, is covered by the $SiO_2$ passivation film 9. In such a case, a metal electrode layer 15 that is provided for the upper electrode layer is formed on the surface of the $SiO_2$ passivation film 9, and the electrical connection between the upper electrode layer and the metal electrode 15 is achieved by a bridge 14 made of polycrystalline Si.

The groove section 2 is formed in a part of the upper surface of the Si waveguide core layer 13. In the lower section of the groove, the n-type or p-type doped lower electrode layer 3 is formed as the lower electrode layer. The layered structure formed by laminating the Si intrinsic semiconductor layer 4 and the SiGe buffer layer 5 is provided so as to cover the lower section and the side wall of the groove section 2. The $Si_xGe_{1-x}$ semiconductor absorption layer 6 is formed on the layered structure, that is, on the SiGe buffer layer 5. The $Si_xGe_{1-x}$ semiconductor absorption layer 6 is formed so as to be embedded in the groove. The shape of the $Si_xGe_{1-x}$ semiconductor absorption layer 6 is selected from a rectangular shape or a reverse tapered shape in dependence upon the shape of the groove section 2. In the upper section of the groove section 2, the p-type or n-type doped lower electrode layer 4 is formed, as the upper electrode layer, on the surface of the $Si_xGe_{1-x}$ semiconductor absorption layer 6 formed in the shape to be embedded in the groove.

In such a case, the upper electrode layer is formed on the top surface of the $Si_xGe_{1-x}$ semiconductor absorption layer 6, but the area size of the upper electrode layer $S_{upper\text{-}electrode\ layer}$ is set smaller than the area size of the top surface $S_{top\ surface}$ of the $Si_xGe_{1-x}$ semiconductor absorption layer 6. The shape of the $Si_xGe_{1-x}$ semiconductor absorption layer 6 is selected as the rectangular shape or the reverse tapered shape, and hence the area size of the top surface $S_{top\ surface}$ and the area size of the bottom surface $S_{bottom\ surface}$ of the $Si_xGe_{1-x}$ semiconductor absorption layer 6 satisfy the condition of $S_{top\ surface} \geq S_{bottom\ surface}$.

Also, in the SiGe photodiode of the third exemplary embodiment shown in FIG. 7, the area size of the upper electrode layer $S_{upper\text{-}electrode\ layer}$ is selected, with respect to the area size of the top surface $S_{top\ surface}$ and the area size of the bottom surface $S_{bottom\ surface}$ of the $Si_xGe_{1-x}$ semiconductor absorption layer 6, so as to satisfy the conditions of $S_{top\ surface} \geq S_{bottom\ surface} > S_{upper\text{-}electrode\ layer}$. The upper electrode defining $SiO_2$ film 8 is formed in the upper section of the groove so as to define the planar shape and the area size of the upper electrode layer. The upper electrode defining $SiO_2$ film 8 is formed into a shape to surround the periphery of the planar shape of the upper electrode layer along the planar shape. Further, the upper electrode defining $SiO_2$ film 8 is formed so as to cover the edge surface which is located at the end of the layered structure formed by laminating the Si intrinsic semiconductor layer 4 and the SiGe buffer layer 5, and which is exposed at the upper section of the groove. As a result, in the upper section of the groove, the top surface of the $Si_xGe_{1-x}$ semiconductor absorption layer 6, and the edge surface of the layered structure formed by laminating the Si intrinsic semiconductor layer 4 and the SiGe buffer layer 5 are covered by the upper electrode defining $SiO_2$ film 8 and the upper electrode layer.

The upper surface of the Si waveguide core layer 13 in which the groove section 2 is provided, including the upper section of the groove section 2, are covered by the $SiO_2$ passivation film 9. The $SiO_2$ passivation film 9 also covers both the side surfaces of the Si waveguide core layer 13.

The upper electrode layer and the lower electrode layer are formed by combining electrode layers each having a different conductivity type, that is, by combining a p-type electrode layer and an n-type electrode layer, or by combining an n-type electrode layer and a p-type electrode layer. On the other hand, the $Si_xGe_{1-x}$ semiconductor absorption layer 6 is formed of $i\text{-}Si_xGe_{1-x}$ semiconductor. Therefore, the diode having the structure embedded in the groove section 2 is constructed as a p-i-n type photodiode. When a reverse bias voltage $V_R$ is applied between the upper electrode layer and the lower electrode layer, the photo-carriers (electrons and holes) which are generated in the $Si_xGe_{1-x}$ semiconductor absorption layer 6, are drifted respectively toward the n-type electrode layer and the p-type electrode layer.

The lower layer insulating film that composes the SOI structure is a Si oxide layer, and is used as the lower clad layer of the Si waveguide. On the other hand, in the portion of the SiGe photodiode of the second exemplary embodiment, the lower layer insulating film functions as the embedded oxide layer 11 provided under the lower electrode layer. It is preferred that the film thickness $d_{lower\text{-}clad}$ of the embedded oxide layer 11 is selected in the range of $d_{lower\text{-}clad} \geq 0.5\ \mu m$. That is, it need to be used to effect electrical separation and optical separation between the Si waveguide core layer 13 and the Si supporting substrate 12, and hence the film thickness said range is preferably selected in said range.

The Si waveguide core layer 13 is selected to have the core section size of the thickness $d_{si\text{-}core}$ and the width $W_{si\text{-}core}$. The size of the groove section 2 that is formed in a part of the Si waveguide core layer 13 is selected to correspond to the core section size. As for the shape of the groove section 2, the shape of the upper opening section of the groove section 2 is selected to be a rectangle, and the vertical sectional shape of the groove section 2 is selected to be a rectangle. When it is assumed that the upper opening section of the groove section 2 has a length $L_{top}$ and a width $W_{top}$, the width $W_{top}$ needs to satisfy the condition of $W_{top} < W_{si\text{-}core}$ with respect to the core section width $W_{si\text{-}core}$. It is preferred that the arrangement of the groove section 2 is selected so that the groove section 2 is positioned at the central portion of the core section. Further, it is preferred that the difference $(W_{si\text{-}core} - W_{top})$ between the width $W_{top}$ and the width $W_{si\text{-}core}$ of the core section satisfies the condition of $(W_{si\text{-}core} - W_{top}) \geq 0.1\ \mu m$.

When the thickness of the lower electrode layer provided under the groove section 3 is set as $d_{lower\text{-}electrode\ layer}$, and the depth of the groove section 2 is set as $d_{trench}$, $(d_{trench} + d_{lower\text{-}electrode\ layer})$ needs to satisfy the condition of $(d_{trench} +$ $d_{lower\text{-}electrode\ layer} \leq d_{si\text{-}core}$. Preferably, $(d_{trench} + d_{lower\text{-}electrode\ layer})$ is selected to satisfy the condition of $(d_{trench} + d_{lower\text{-}electrode\ layer}) = d_{si\text{-}core}$.

The SiO$_2$ passivation film 9 covers the upper surface and both the side surfaces of the Si waveguide core layer 13.

The SiO$_2$ passivation film 9 covering the upper surface of the Si waveguide core layer 13 exhibits the function as the upper clad layer in dependence upon the film thickness of the SiO$_2$ passivation film 9. In the third exemplary embodiment in which the SiO$_2$ passivation film 9 is used as the upper clad layer, it is preferred that the film thickness $d_{sio2\text{-}passivation}$ of the SiO$_2$ passivation film 9 is selected in the range of $2\ \mu m \geq d_{sio2\text{-}passivation} \geq 0.1\ \mu m$.

By using the SiO$_2$ passivation film 9 as the upper clad layer, the peak position of the mode field of the light propagating in the Si waveguide core layer 13 can be made to coincide with the center of the Si$_x$Ge$_{1-x}$ semiconductor absorption layer.

In the second exemplary embodiment mentioned above, the film thickness $d_{sio2\text{-}passivation}$ of the SiO$_2$ passivation film 9 is thin, and hence the peak position of the mode field of the light propagating in the Si waveguide core layer 13 is not positioned at the center of the Si$_x$Ge$_{1-x}$ semiconductor absorption layer, but is deviated to the upper surface side of the Si waveguide core layer 13. On the other hand, in the third exemplary embodiment, the film thickness of the SiO$_2$ passivation film 9 $d_{sio2\text{-}passivation}$ is increased, so that the peak position of the mode field of the light propagating in the Si waveguide core layer 13 is prevented from being deviated to the upper surface side, and can be set close to the center of the Si$_x$Ge$_{1-x}$ semiconductor absorption layer.

Therefore, when the Si$_x$Ge$_{1-x}$ semiconductor absorption layer is butt-connected to the Si waveguide core layer 13, the optical coupling efficiency can be further improved. The optical coupling efficiency of 95% can also be attained by optimizing the film thickness $d_{sio2\text{-}passivation}$ of the SiO$_2$ passivation film 9.

In such a case, the metal electrode layer 15 that is used for the upper electrode layer is provided on the surface of the SiO$_2$ passivation film 9, and the electrical connection between the upper electrode layer and the metal electrode 15 is attained by the bridge 14 made of polycrystalline Si. The bridge 14 made of polycrystalline Si is produced in such a manner that a hole is formed so as to perforate the SiO$_2$ passivation film 9, and that p-type doped polycrystalline Si is deposited by the CVD method so as to fill up in the hole. It is also possible that a plurality of the bridges 14 made of polycrystalline Si are provided, and that each of the bridges 14 are periodically arranged. In such a case, a structure, in which the effective refractive index is periodically changed due to the periodically arranged bridges 14, is introduced in the SiO$_2$ passivation film 9. The structure, in which the effective refractive index is periodically changed, can be made to function as a refractive-index phase grating. That is, the structure can be made to function as a grating for selecting light of a specific wavelength range from the light propagating in the Si waveguide. As a result, in the SiGe photodiode of the third exemplary embodiment, the wavelength dependence is also added to the photo-detection sensitivity in correspondence with the light of the specific wavelength range selected by the grating function.

As a specific example of the SiGe photodiode of the third exemplary embodiment shown in FIG. 7, an example (exemplary embodiment) of structure of a p-i-n type SiGe photodiode, in which a combination of a p-type upper electrode layer and an n-type lower electrode layer is selected as the upper electrode layer and the lower electrode layer, and a process for production thereof will be described below.

FIGS. 8-1, 8-2 and 8-3 are sectional views showing an example of process for production of the SiGe photodiode of the third exemplary embodiment. In the specific example shown in the figures, the process for production will be illustrated by referring to a case in which a Ge layer is employed as the Si$_x$Ge$_{1-x}$ semiconductor absorption layer.

Figures 1, 8:
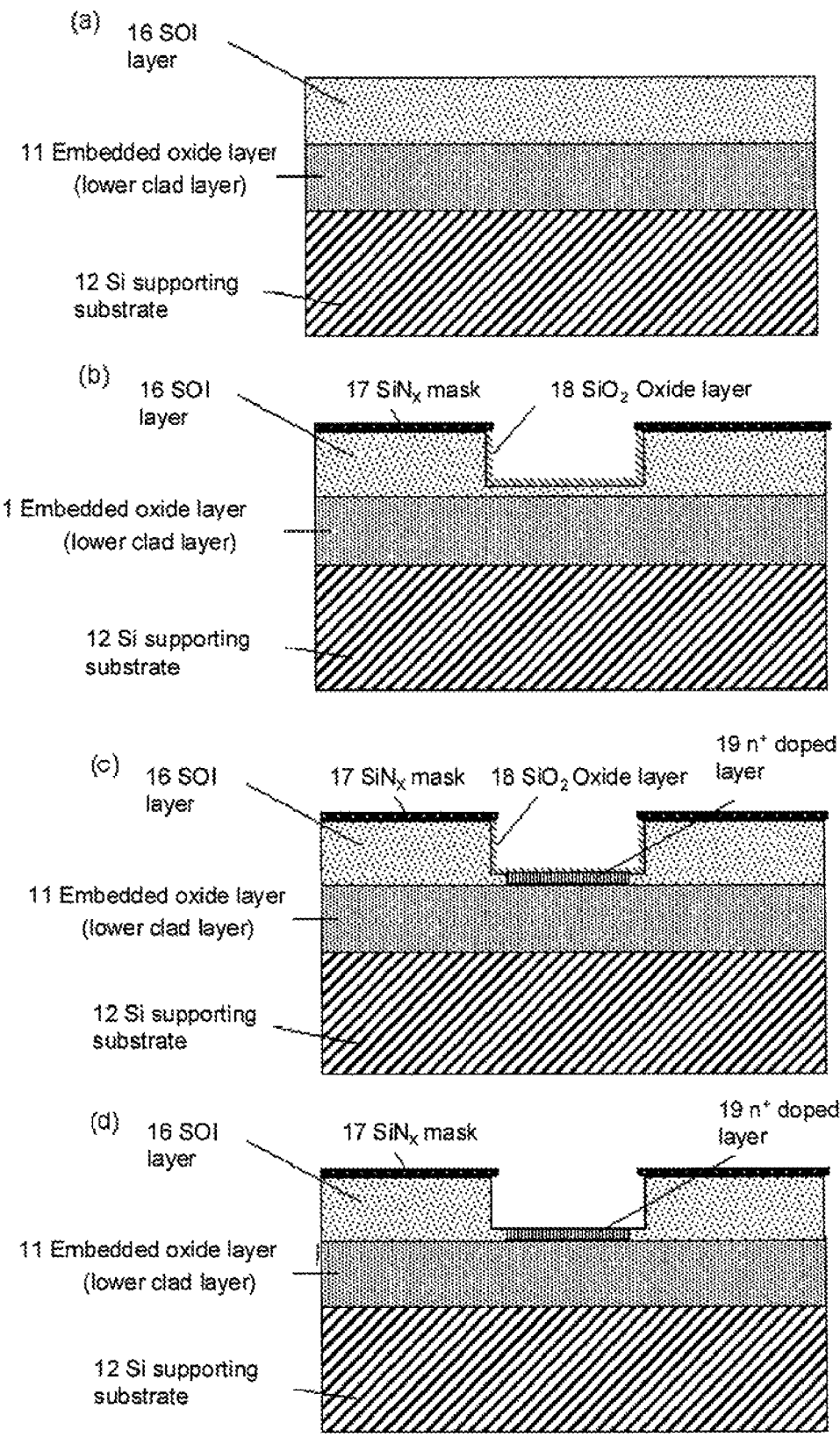
Figures 2, 8:
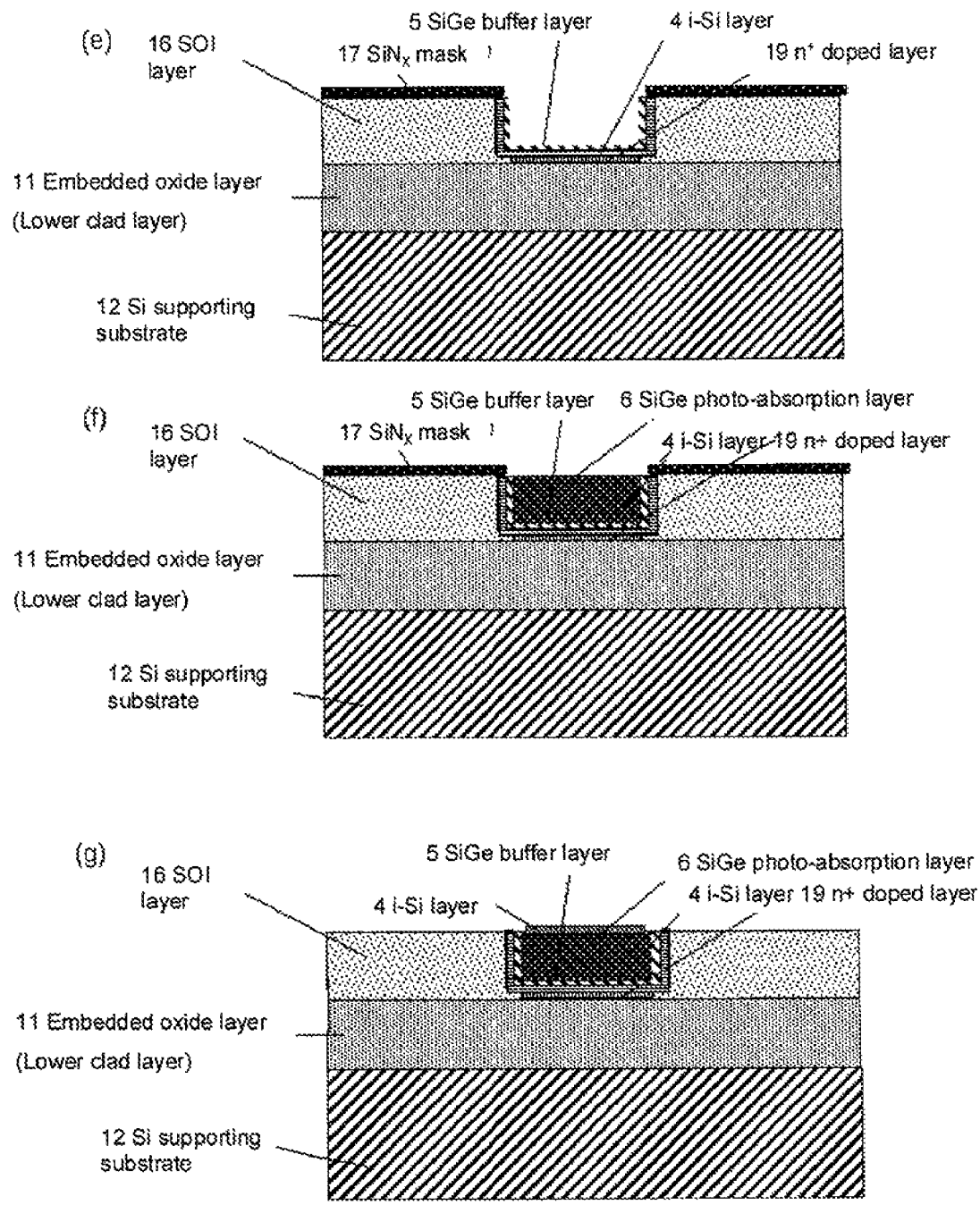
Figures 3, 8:
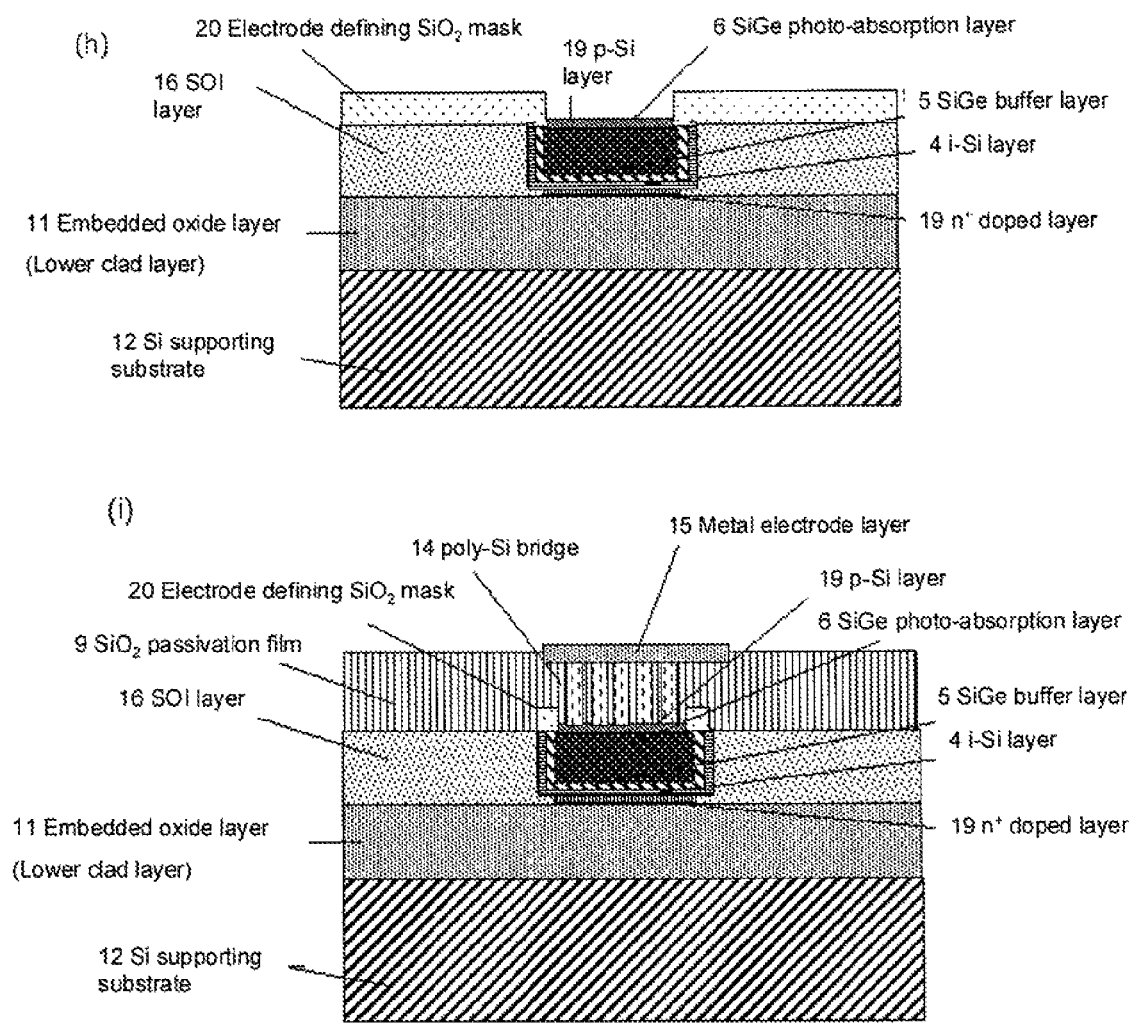

As shown in step (a) in FIG. 8-1, an SOI layer 16 that is formed on the Si supporting substrate 12 is used as the Si layer. In such a case, the insulating layer used to form the SOI structure, that is, the Si oxide film, is used as the embedded oxide layer 11. The SOI layer 16 used in this example is an n-type doped Si layer. The specific resistance of the Si layer is set to be as low as 1 to 10 Ω·cm, and the donor concentration doped therein is as low as $10^{15}$ to $10^{16}$ cm$^{-3}$.

The region, in which the SiGe photodiode is to be produced, is formed by applying patterning processing to the Si waveguide core layer 13 of the Si waveguide. In the portion that composes the Si waveguide core layer 13, the film thickness of the SOI layer 16 is set to the thickness $d_{si\text{-}core}$ of the Si waveguide core layer 13.

In this example, the shape of the Si waveguide core layer 13 is selected so that the thickness $d_{si\text{-}core}=0.3\ \mu m$ (300 nm) and the width $W_{si\text{-}core}=0.5\ \mu m$. In such a case, the photo-detection section that composes the photodiode is provided in the region in which the waveguide width is sufficiently large by being gradually increased according to a tapered shape.

In the optical transmission path of the Si waveguide, the Si waveguide core layer 13 having the width $W_{si\text{-}core}=0.5\ \mu m$ is employed, and the electric field of guided light is effused from the core layer to the clad section. On the other hand, in the photo-detection section that composes the photodiode, the ratio of the electric field effused to the clad section is relatively reduced by increasing the width of the core layer, so as to thereby reduce the influence of the absorption loss due to the electrode, and the like. Further, in order to reduce the light scattering in the photo-detection section, the photodiode is arranged in the region in which the waveguide width is gradually increased according to the tapered shape.

As for the crystal orientation of the SOI layer 16, the plane orientation of the layer is set to (100). In such a case, the light propagation direction of the Si waveguide core layer 13 in the portion in which the groove section 2 is formed, is selected to be the <011> direction in this example. The planar shape of the groove section 2 is formed in a rectangle in which the direction of the length L is set as the light propagating direction, and in which the direction of the width W is set to coincide with the width direction of the Si waveguide core layer 13 that is perpendicular to the light propagation direction.

Step (b) is a step for forming a recessed section in a part of the SOI layer 16 which is used as the Si waveguide core layer 13.

A SiN$_x$ film is formed on the surface of the SOI layer 16, to produce a SiN$_x$ mask 17 having an opening section provided in the portion in which the groove section 2 is to be produced. A part of the SOI layer 16 is removed by reactive etching by using the SiN$_x$ mask 17 as an etching mask. The SOI layer 16 is etched by the depth $d_{etching}$ from the opening section, to form the recessed section. The opening section of the SiN$_x$ mask 17 is set to be, for example, a rectangle having the Length $L_{etching\text{-}mask}=10\ \mu m$ and the width $W_{etching\text{-}mask}=4.5\ \mu m$. The depth $d_{etching}$ of the recessed section is selected as $d_{etching}=200\ nm$.

In the reactive etching, C$_4$F$_8$ and SF$_6$ gases are mixed to use as the reactive gas. Further, in the formation of the SiN$_x$ film, for example, the PE-CVD method is used, and the film thickness $d_{SiNx}$ of the $SiN_x$ film to be deposited is selected as $d_{SiNx}$=100 nm.

Further, the surface of the exposed SOI layer 16 is subjected to heat treatment in steam at 1000° C. for about 14 minutes. By this oxidation treatment in steam, a $SiO_2$ oxide film 18 having a film thickness of about 20 nm is formed in the bottom section and the side wall surface of the recessed section which is formed by the etching.

Step (c) is a step for producing the n-type lower electrode layer which is provided under the groove section 2.

P (phosphorus) is ion-implanted (at acceleration voltage of 10 keV) at such a high density as $1\times10^{18}/cm^3$ in the bottom surface of the recessed section which is coated and protected by the $SiO_2$ oxide film 18. The ion implantation region is set to be a rectangle having, for example, the length $L_{n-implant}$=9.5 μm and the width $W_{n-implant}$=4 μm. Further, the depth $d_{n-implant}$ of the ion implantation is set to be as shallow as 100 nm. In such a case, the ion implantation to the wall surface of the recessed section is blocked by using the $SiO_2$ layer.

The P implanted therein is activated by performing the heat treatment at 800° C. for about one minute by using, the Rapid Thermal Annealing method, such as lamp heating, in which treatment the $SiO_2$ oxide film 18 is used as the protection film. An $n^+$ doped layer 19 is produced in the ion implantation region by the activation treatment. The thickness $d_{lower-electrode\ layer}$ of the $n^+$ doped layer 19 is as shallow as 100 nm.

Step (d) is a step for removing the $SiO_2$ oxide film 18 and producing the groove section 2.

After the activation treatment, the $SiO_2$ oxide film 18 is removed by etching using BHF (buffered fluoric acid).

As a result, the groove section 2, in the lower section of which the n-type lower electrode layer is formed, is produced. In this example, the depth $d_{trench}$ of the groove section 2 to be produced is as shallow as 200 nm. Further, the shape of the lateral cross section of the groove section 2 is also selected to be a rectangle. The size of the upper opening section of the groove section 2 is selected as the length $L_{top}$=10 μm and the width $W_{top}$=4.5 μm, and the size of the bottom section of the groove section 2 is selected as the length $L_{bottom}$=10 μm and the width $W_{bottom}$=4.5 μm. Therefore, the groove section 2 is formed into a rectangular shape.

Step (e) is a step for forming the layered structure composed of the i-Si layer 4 and the SiGe buffer layer 5 so that the bottom section and the side wall surface of the groove section 2 are covered by the layered structure.

In this example, a $Si_{0.5}Ge_{0.5}$ buffer layer is employed as the SiGe buffer layer 5.

First, the i-Si layer 4 having such a thin thickness as 20 nm is formed on the bottom section and the side wall surface of the groove section 2 by the UHV-CVD method in which $Si_2H_6$ is used as the source gas, at the substrate temperature of 500° C. Subsequently, a $Si_{0.5}Ge_{0.5}$ buffer layer is laminated thereon by the UHV-CVD method in which the substrate temperature is set to 400° C. to 550° C., and $Si_2H_6$ and $GeH_4$ are used as the source gas. The film thickness $d_{SiGe-buffer}$ of the laminated $Si_{0.5}Ge_{0.5}$ buffer layer is set to 10 nm or more.

In this example, when light enters the Ge photo-absorption layer 18 from the Si waveguide core layer 13, the incident light passes through the interface between the i-Si layer 4 and the SiGe buffer layer 5 and through the interface between the SiGe buffer layer 5 and the Ge photo-absorption layer 18. The film thickness $d_{SiGe-buffer}$ of the SiGe buffer layer 5 is adjusted so that the optical impedance matching is effected in the interfaces.

The specific refractive index of i-Si is set as $n_{i-Si}$=3.45, and the specific refractive index of $Si_{0.5}Ge_{0.5}$ buffer layer is set as $n_{SiGe-buffer}$=3.75. In such a case, when the wavelength of the incident light in the vacuum is set as $\lambda_0$=1550 nm, the film thickness $d_{SiGe-buffer}$ of the SiGe buffer layer 5 is selected to be 10 to 100 nm. Note that the condition of $d_{SiGe-buffer}\cdot n_{SiGe}\approx 1/4\cdot\lambda_0$ corresponds to $d_{SiGe-buffer}\approx 100$ nm.

Step (f) is a step for growing a Ge layer on the layered structure composed of the i-Si layer 4 and the SiGe buffer layer 5 to form the Ge photo-absorption layer 18.

First, a Ge seed layer is grown on the $Si_{0.5}Ge_{0.5}$ buffer layer by the UHV-CVD method in which the substrate temperature is set to 300° C. to 370° C., and $GeH_4$ is used as source gas. In such a case, the film thickness $d_{Ge-seed}$ of the Ge seed layer is set in the range of several tens nm. Subsequently, a Ge layer is grown on the Ge seed layer by the UHV-CVD method in which the substrate temperature is set to 550° C. to 650° C., and $GeH_4$ is used as the source gas. In such a case, the film thickness $d_{Ge}$ of the Ge layer is selected to be in the range of one hundred several tens nm.

Therefore, the film thickness $d_i$ of the Ge photo-absorption layer 18 produced in the structure embedded in the groove section 2 corresponds to $(d_{Ge-seed}+d_{Ge})$, and is set to about 190 nm. In such a case, the sum $(d_{i-Si-bottom}+d_{SiGe-buffer}+d_i)$ of the film thickness $d_{i-Si-bottom}$ of the i-Si layer 4 deposited on the bottom surface of the groove section 2, the film thickness $d_{SiGe-buffer}$ of the SiGe buffer layer 5, and the film thickness $d_i$ of the Ge photo-absorption layer 18 is set to about 200 nm. That is, the depth $d_{trench}$ of the groove section 2 and the sum of the film thicknesses $(d_{i-Si-bottom}+d_{SiGe-buffer}+d_i)$ are set as $d_{trench}\approx(d_{i-Si-bottom}+d_{SiGe-buffer}+d_i)$. As a result, the surface of the Ge photo-absorption layer 18 reaches the same level as the lower surface of the $SiN_x$ mask 17.

The size of the bottom section of the Ge photo-absorption layer 18 is set as the length $L_{i-bottom}$=10 μm and the width $W_{i-bottom}$=4.5 μm, while the size of the portion exposed on the surface side of the groove section 2 is set as the length $L_{i-top}$=10 μm and the width $W_{i-top}$=4.5 μm.

Step (g) is a step for forming, on the surface of the Ge photo-absorption layer 18, the i-Si layer 19 which is used to produce the upper electrode layer.

The i-Si layer 19 is grown on the surface of the Ge photo-absorption layer 18 by the UHV-CVD method in which the substrate temperature is set to 600° C., and $Si_2H_6$ is used as the source gas. In such a case, the film thickness $d_{i-Si-top}$ of the i-Si layer 19 is selected to be as thick as 50 nm.

Thereafter, the $SiN_x$ mask 17 covering the surface of the SOI layer 16 is removed. The $SiN_x$ film is removed by being selectively etched in such a manner that the $SiN_x$ film is dipped in hot phosphoric acid at about 130° C. for about 1 hour.

Step (h) is a step for forming the p-type upper electrode layer by using the i-Si layer 19.

First, a $SiO_2$ film is deposited by the plasma CVD method so as to cover the upper surface of the SOI layer 16. The film thickness of the $SiO_2$ film is selected to be about 100 nm. An opening section is provided in the $SiO_2$ film at the position corresponding to the upper surface of the i-Si layer 19, and thereby, an electrode defining $SiO_2$ mask 20 serving as a mask pattern for ion implantation is produced. The size of the opening section provided in the electrode defining $SiO_2$ mask 20 is set smaller than the size of the bottom section of the Ge photo-absorption layer 18. In this example, the size of the opening section is selected as the length $L_{mask-opening}$=9.2 μm and the width $W_{mask-opening}$=3.8 μm. In the patterning to form the opening section, the $SiO_2$ film is etched by being subjected to the BI-IF treatment using a resist mask having the desired pattern.

B (boron) is ion-implanted at such high density as $1\times10^{20}/cm^{-3}$ in the upper surface of the i-Si layer 19, which is exposed in the opening section. The ion implantation region is set to a rectangle having the length $L_{p\text{-}implant}$=3.8 μm and the width $W_{p\text{-}implant}$=9.2 μm. Further, the depth $d_{p\text{-}implant}$ of the ion implantation is set to as shallow as 100 nm.

The B implanted therein is activated by performing heat treatment using the Rapid Thermal Annealing method, such as lamp heating, at 800° C. for about one minute. The p-Si layer 19 is produced by the activation treatment. The thickness of the p-Si layer 19 is set as $d_{upper\text{-}electrode\ layer}$=about 50 nm. The p-Si layer 19 produced thereby is used as the p-type upper electrode layer.

Thereafter, the portion of the electrode defining $SiO_2$ mask 20, which covers the upper surface of the SOI layer 16, is removed by etching, whereas the portion of the electrode defining $SiO_2$ mask 20, which covers the surface of the groove section 2, is left.

Step (i) is a step for forming the $SiO_2$ passivation film 9 covering the Si waveguide core layer 13, and for producing the polycrystalline Si bridge 14 which electrically connects the p-Si layer 19 to the metal electrode layer 15 that is to be formed on the upper surface of the $SiO_2$ passivation film 9.

The $SiO_2$ passivation film 9 is formed by the CVD method so as to cover the SOI layer 16 which is patterned into the shape of the Si waveguide core layer 13. The $SiO_2$ passivation film 9 is formed to have a sufficient film thickness to cover the level difference due to the electrode defining $SiO_2$ mask 20. The film thickness $d_{sio2\text{-}passivation}$ of the $SiO_2$ passivation film 9 is selected to be 1 to 2 μm.

A hole is produced at the position above the p-Si layer 19 so as to reach the surface of the p-Si layer 19 from the upper surface of the $SiO_2$ passivation film 9. The p-type doped poly-Si is formed by the CVD method so as to fill up in the hole. The p-type poly-Si formed therein is used as the polycrystalline Si bridge 14. A Ti/Al (1 μm) layer is formed on the upper surface of the $SiO_2$ passivation film 9, so as to be used as the metal electrode layer 15 for the polycrystalline Si bridge 14.

As a result, the p-Si layer 19 is electrically connected to the metal electrode layer 15 via the polycrystalline Si bridge 14.

The size of the lateral cross section of the polycrystalline Si bridge 14 to be produced thereby is selected to be a rectangle having the length $L_{bridge}$=0.2 μm and the width $W_{bridge}$=3.5 μm, and the height $H_{bridge}$ thereof is set to be equal to the film thickness $d_{sio2\text{-}passivation}$ of the $SiO_2$ passivation film 9.

On the other hand, the embedded oxide film 11 is provided under the SOI layer 16 that is used as the Si waveguide core layer 13, and the $SiO_2$ passivation film 9 is provided on the SOI layer 16. In the region of the Si waveguide, the embedded oxide film 11 functions as the lower clad layer, and the $SiO_2$ passivation film 9 functions as the upper clad layer. In the case where the film thickness of the Si waveguide core layer 13 is selected as $d_{si\text{-}core}$=0.3 μm, the film thickness of the embedded oxide film 11 is selected as $d_{lower\text{-}clad}$=1 μm, and the film thickness of the $SiO_2$ passivation film 9 is selected as $d_{sio2\text{-}passivation}$=1 μm, the peak position of the mode field of the light propagating in the Si waveguide core layer 13 is located substantially at the center of the Si waveguide core layer 13. Therefore, the peak position of the light propagating in the Si waveguide core layer 13 is located at the position of about 0.15 μm from the upper surface of the Si waveguide core layer 13.

At this embodiment, in order to reduce the optical connection loss, the level difference at the connecting section can be improved by selecting the shape of the SiGe photo-absorption layer 6 as a reverse tapered shape.

When the shape of the SiGe photo-absorption layer 6 is formed into the reverse tapered shape, it is preferred that the inclination angle $\theta_{taper}$ of the side wall surface is selected in the range of $90°>\theta_{taper}\geq15°$. When the shape of the SiGe photo-absorption layer 6 is formed into the reverse tapered shape, the shape of the groove 2 is also correspondingly formed into the reverse tapered shape.

When the SiGe photo-absorption layer 6 is set to have the film thickness $d_i$=200 nm, and to have the bottom section size of the length $L_{i\text{-}bottom}$=8 μm and the width $W_{i\text{-}bottom}$=4 μm, the optical connection efficiency is estimated to be improved by about 10% by changing from a rectangular shape to a reverse tapered shape with $\theta_{taper}$=about 75°.

Fourth Exemplary Embodiment

Figure 9:
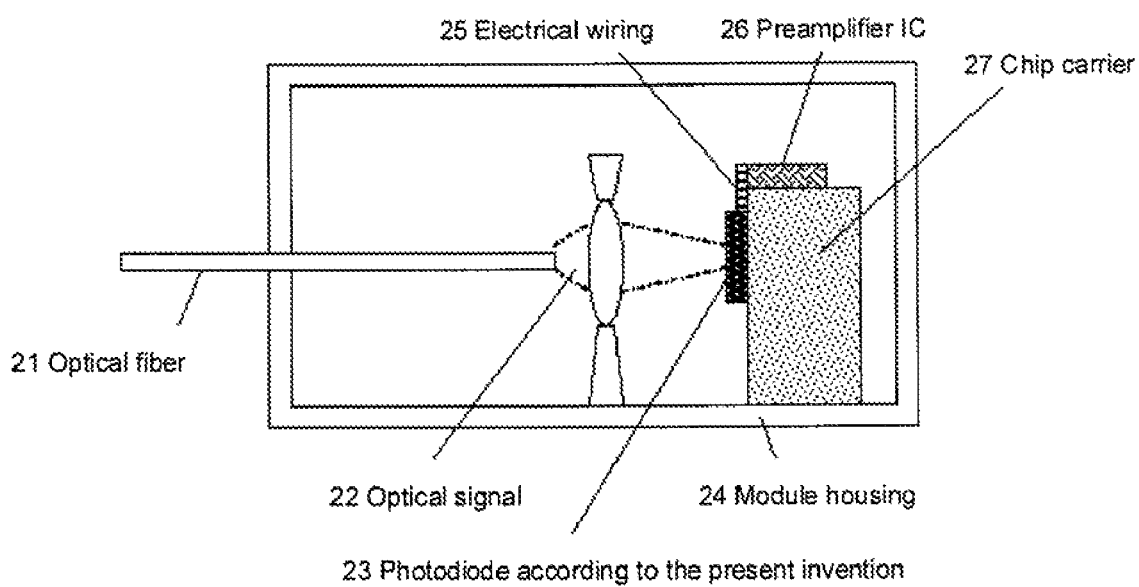
FIG. 9 is a drawing schematically showing an example of a structure of a photo-detection module for 40 Gbps transmission, in which the SiGe photodiode according to the present invention is mounted.

FIG. 9 shows a photo-detection module for 40 Gbps (gigabits per second) transmission, to which the SiGe photodiode according to the present invention is mounted.

In the figure, in the photodiode, the PIN junction is formed by using the substrate in which the SiGe film is selectively epitaxially grown on the Si waveguide formed on the SOI substrate. The photodiode is mounted on the chip carrier 38. It is optically coupled to an optical fiber 37 with a lens, and is electrically connected to the subsequent stage preamplifier IC 37.

In the conventional 40 Gbps photo-detection module, a side surface incident waveguide type photodiode is used as the photodiode mounted in the module in many cases. This is because high quantum efficiency is not obtained when the absorption layer is made thin in order to reduce charge carrier travelling time in the surface incident type photodiode in which light is made incident on the semiconductor surface. Further, the side surface incident waveguide type photodiode absorbs light in the in-plane direction of the absorption layer, which makes it possible to obtain high quantum efficiency while maintaining the short charge carrier travelling time.

The Si semiconductor CMOS process can be applied to the SiGe photodiode having the aforementioned structure, and hence it is possible to reduce the cost of the receiving module for optical transmission. In the 40 Gbps photo-detection module using the SiGe photodiode having the aforementioned structure shown in FIG. 9, it was confirmed that the minimum detection sensitivity of −12 dBm is obtained in the transmission using the wavelength of 1.55 and that it is possible to realize the performance level equivalent to that of the 40 Gbps receiving module to which the conventional side surface incident waveguide type compound semiconductor based photodiode is mounted.

(Fifth Exemplary Embodiment)

Figure 10:
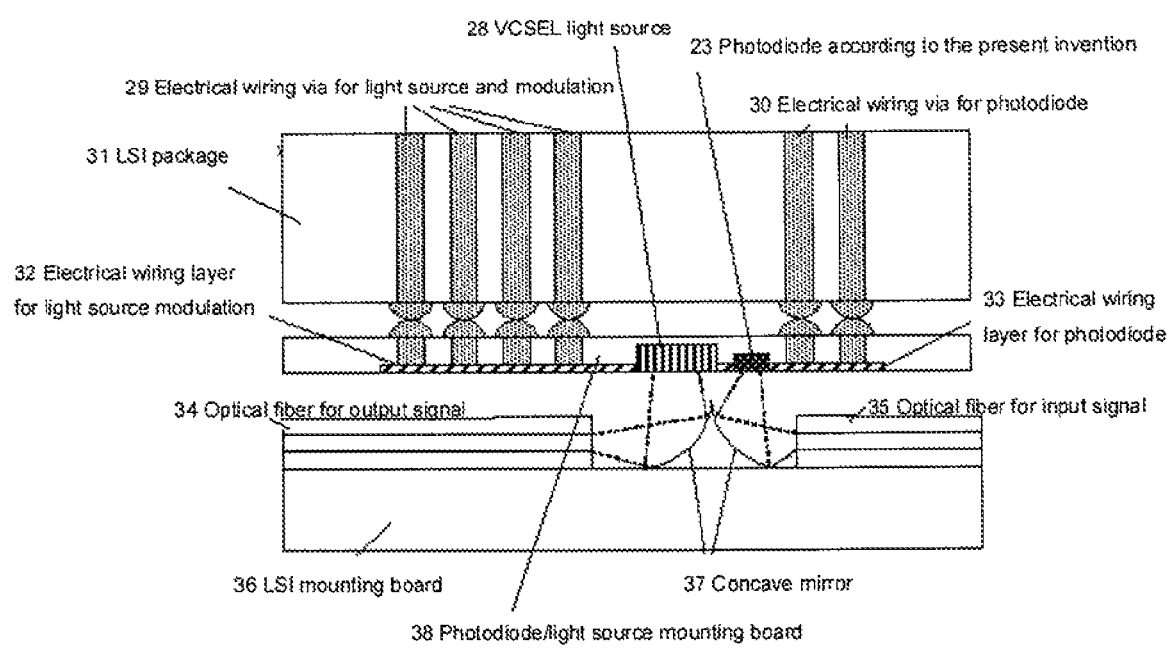
FIG. 10 is a drawing schematically showing an example of a structure of an interconnection with an LSI chip, in which the SiGe photodiode according to the present invention is mounted.

FIG. 10 shows a structure of optical interconnection with an LSI chip to which the SiGe photodiode according to the present invention is mounted.

In the figure, the optical signal from the optical signal input fiber 28 is irradiated, by a concave mirror 30, to the edge surface of the waveguide coupling type photodiode 20 according to the present invention.

In optical interconnection having the quite similar structure, when light of the wavelength of 1300 nm is used, SiGe is used as the semiconductor material of the photodiode. In the photodiode made of SiGe, the optical coupling of the power of an optical signal transmitted through the Si waveguide core layer is effected by a poly Si bridge array in the state of wave number matching, and thereby a photo current is generated so that the current corresponding to the optical signal is made to flow into the LSI through a photodiode wiring layer 26. The coupling tolerance in positioning between the concave mirror and the photodiode can be set to ±1 μm or more by making the waveguide edge surface surrounded in the tapered shape.

The photodiode wiring layer 26 is electrically connected to a via 23 for photodiode wiring of the LSI. Here, instead of the optical fiber, the other optical waveguide means, such as a known planar optical waveguide, can also be used for the input of the optical signal. Further, a condensing mechanism, such as a convex lens, can also be used as the light condensing means instead of the concave mirror. Further, a preamplifier for electrical signal amplification can also be provided in the course of the photodiode wiring layer immediately after the photodiode.

The electrical signal from the LSI passes through an electrical wiring layer 25 for light source and modulation from an electrical signal via 22 for light source and modulation, so as to be converted into an optical signal by a VCSEL (surface emitting laser) light source 21 provided with an electric modulation mechanism. The optical signal is reflected by the concave mirror 30 so as to be sent to an optical signal output fiber 27. The electric modulation mechanism that is provided in the VCSEL light source 21 can be replaced with the other known mechanism which modulates light with an electric signal, for example, a Mach-Zehnder type modulator which modulates light from an external light source by using an electro-optical effect or a thermooptic effect.

Here, in the case if high-speed operation at 20 GHz or higher is aimed in the conventional interconnection between the LSI chips, a compound semiconductor material, such as InGaAs grown on an InP substrate or the like is used for the photodiode mounted in the LSI in order to attain high speed response. The compound semiconductor has a disadvantage of high cost because it has low compatibility with the process for manufacturing Si semiconductor device.

On the other hand, in the photodiode according to the present invention, since SiGe is used, its manufacturing cost can be reduced because the technology for manufacturing CMOS can be used by using a Si substrate similarly to the manufacturing of a Si photodiode. Further, in the interconnection according to the present invention as illustrated in FIG. 10, high-speed optic-to-electric conversion operation at 20 to 40 GHz was confirmed.

Although, so far the present invention has been described with reference to exemplary embodiments (and examples thereof), the present invention will not be limited to the above described exemplary embodiments (and examples thereof). The constitutions and details of the present invention are subject to various modifications which can be understood by those skilled in the art, within the scope of the present invention.

This application is the National Phase of PCT/JP2009/054429, filed Mar. 9, 2009, which claims the benefit of priority based on Japanese Patent Application No. 2008-57961 filed in Japan on Mar. 7, 2008, of which entirety is incorporated herein by reference.

Industrial Applicability

The photodiode according to the present invention can be used as a photodiode which is used in the field of information processing and communication, and which converts an optical signal including an optical signal of infrared region into an electric signal at high speed. In particular, the photodiode according to the present invention can be suitably used as a SiGe photodiode which converts an optical signal of 1.3 μm band to 1.55 μm band into an electric signal at high speed.

The invention claimed is:

1. A SiGe photodiode, which is a p-i-n type photodiode composed of a $Si_xGe_{1-x}$ semiconductor absorption layer, an upper electrode layer provided on the top face thereof, and a lower electrode layer provided under the rear face thereof, wherein the p-i-n type photodiode has a structure in which the $Si_xGe_{1-x}$ semiconductor absorption layer is embedded in a groove formed in a part of a Si layer, and which comprises:

a p-type or n-type doped lower electrode layer which is formed in a lower section of the groove;

a layered structure composed of, a Si semiconductor layer and a SiGe buffer layer, which structure is formed on the lower section and the side wall of the groove;

the $Si_xGe_{1-x}$ semiconductor absorption layer which is formed on the layered structure; and a n-type or p-type doped upper electrode layer which is formed in an upper section of the groove.

2. The SiGe photodiode according to claim 1, wherein the upper electrode layer is formed on the top surface of the $Si_xGe_{1-x}$ semiconductor absorption layer, and wherein the area size $S_{upper\text{-}electrode\ layer}$ of the upper electrode layer and the area size $S_{bottom\ surface}$ of the bottom surface of the $Si_xGe_{1-x}$ semiconductor absorption layer are selected so as to satisfy the relationship of $S_{bottom\ surface} > S_{upper\text{-}electrode\ layer}$.

3. The SiGe photodiode according to claim 1, wherein the p-i-n type photodiode is optically connected to a Si waveguide, and wherein, when the $Si_xGe_{1-x}$ semiconductor absorption layer is optically connected to the Si waveguide via the layered structure of the Si intrinsic semiconductor layer and the SiGe buffer layer, impedance matching is effected at the optical connection portion.

4. The SiGe photodiode according to claim 1, wherein the upper electrode layer is electrically connected to an upper metal electrode layer, and wherein the electric connection between the upper electrode layer and the upper metal electrode layer is achieved by a bridge structure made of polycrystalline Si.

5. The SiGe photodiode according to claim 4, wherein the bridge structure made of polycrystalline Si is composed of a polycrystalline Si bridge array, and wherein the polycrystalline Si bridge array has a structure in which a plurality of polycrystalline Si bridges are periodically arranged, and in which the selection of a wavelength region is made by the periodic structure.

6. An optical wiring system on an LSI, comprising, as a photo-detection section, the SiGe photodiode according to claim 1.

7. An optical interconnection module comprising: a Si substrate in which the SiGe photodiode according to claim 1 is formed; and an LSI electronic circuit which is formed on the Si substrate monolithically with the photodiode.

8. The SiGe photodiode according to claim 2, wherein the layered structure composed of the Si semiconductor layer and the SiGe buffer layer, which structure is formed on the lower section and the side wall of the groove, is a layered structure formed by laminating the Si intrinsic semiconductor and the SiGe buffer layer.

9. The SiGe photodiode according to claim 2, wherein the $Si_xGe_{1-x}$ semiconductor absorption layer which is formed on the layered structure is the $Si_xGe_{1-x}$ semiconductor absorption layer having a rectangular shape or a reverse tapered shape.

* * * * *